(12) United States Patent
Fastow et al.

(10) Patent No.: US 10,325,665 B2
(45) Date of Patent: Jun. 18, 2019

(54) BLOCK BY DECK OPERATIONS FOR NAND MEMORY

(71) Applicant: INTEL CORPORATION, Santa Clara, CA (US)

(72) Inventors: Richard Fastow, Cupertino, CA (US); Xin Sun, Fremont, CA (US); Uday Chandrasekhar, Santa Clara, CA (US); Krishna K. Parat, Palo Alto, CA (US); Camila Jaramillo, San Jose, CA (US); Purval S. Sule, Folsom, CA (US); Aliasgar S. Madraswala, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/836,124

(22) Filed: Dec. 8, 2017

(65) Prior Publication Data

US 2019/0043591 A1    Feb. 7, 2019

(51) Int. Cl.
| | |
|---|---|
| *G11C 5/14* | (2006.01) |
| *G11C 16/28* | (2006.01) |
| *G11C 16/16* | (2006.01) |
| *G11C 16/34* | (2006.01) |
| *G11C 11/4074* | (2006.01) |
| G11C 16/04 | (2006.01) |

(52) U.S. Cl.
CPC .......... *G11C 16/28* (2013.01); *G11C 11/4074* (2013.01); *G11C 16/16* (2013.01); *G11C 16/3436* (2013.01); *G11C 16/0483* (2013.01)

(58) Field of Classification Search
CPC ..... G11C 16/0483; G11C 16/16; G11C 16/26; G11C 16/3495; G11C 16/10; G11C 16/08; G11C 16/30; G11C 8/08; G11C 16/04; G11C 16/0416; G11C 16/107; G11C 16/12; G11C 16/3404
See application file for complete search history.

(56) References Cited

U.S. PATENT DOCUMENTS

| | | | |
|---|---|---|---|
| 6,295,227 B1 | 9/2001 | Sakui et al. | |
| 2016/0267995 A1 | 9/2016 | Chang et al. | |
| 2017/0076805 A1* | 3/2017 | Goda ................ | G11C 16/16 |

OTHER PUBLICATIONS

Search Report dated Apr. 8, 2019, issued in European Patent Application No. 18204766.2, 15 pages.

* cited by examiner

*Primary Examiner* — Thong Q Le
(74) *Attorney, Agent, or Firm* — Schwabe, Williamson & Wyatt, P.C.

(57) ABSTRACT

A controller for a NAND memory array is presented. In embodiments, the controller may include circuitry to provide bias voltages to a NAND memory array that includes two or more decks of memory cells, and an output interface coupled to the circuitry and to wordlines (WLs) of the memory array. In embodiments, the circuitry, in a deck erase operation may: apply a first set of bias voltages via the output interface to active WLs of at least a first deck of the two or more decks of memory cells to be erased; and apply a second set of bias voltages via the output interface to active WLs of at least a second deck of the two or more decks of memory cells not to be erased, wherein the first set of bias voltages is lower than the second set of bias voltages.

25 Claims, 19 Drawing Sheets

BLOCK BY DECK OPERATIONS FOR NAND MEMORY

FIELD

Embodiments of the present disclosure generally relate to the field of integrated circuits (IC), and more particularly, to block by deck operations for a NAND memory.

BACKGROUND

In recent years, NAND memory arrays have been developed. A NAND memory array may be non-planar. It may include a plurality of memory cells stacked over one another. They may be stacked vertically or horizontally. Moreover, the memory cells may share a common channel region, such as one formed as a respective pillar of semiconductor material (e.g., polysilicon) about which the plurality of memory cells may be formed.

DETAILED DESCRIPTION

Figure 1:
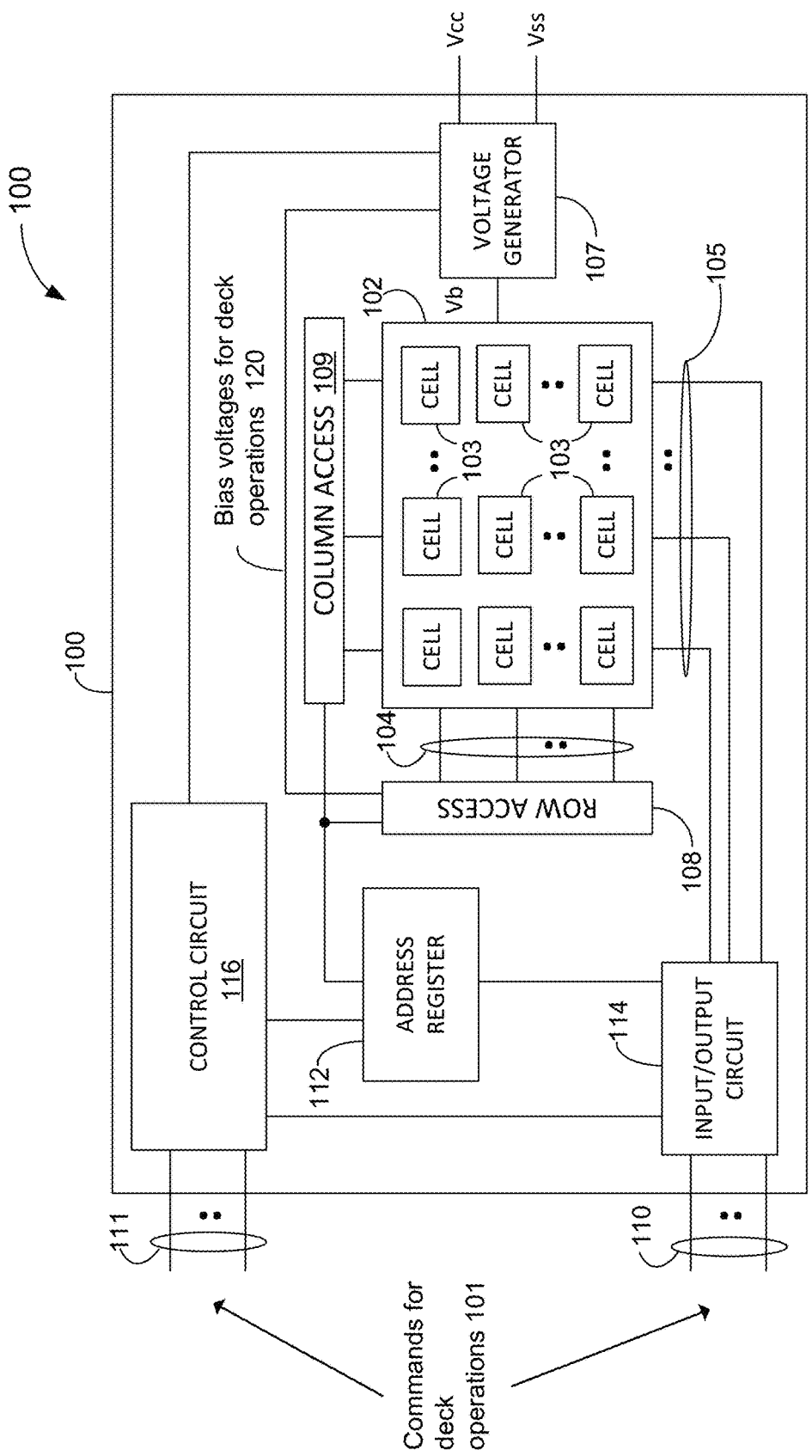
FIG. 1 illustrates an example memory device comprising a NAND memory array, in accordance with various embodiments.

In embodiments, block by deck erase, program, and read operations may be performed on a NAND memory array. The NAND memory array may be non-planar. In embodiments, the NAND memory array may include a plurality of memory cells stacked over one another. In embodiments, they may be stacked vertically or horizontally. Moreover, the memory cells may share a common channel region, such as one formed as a respective pillar of semiconductor material (e.g., polysilicon) about which the plurality of memory cells may be formed.

In embodiments, a "deck" of a memory array refers to a portion of a physical memory array that includes a subset of its memory cells. Thus a "block by deck" operation of the memory array refers to operating at the deck level, and not on the whole memory array, or memory block, at one time. By applying bias voltages to different physical wordlines of the memory block in different combinations, a memory array may be divided into two, three, four, or more logical decks, each of which may be treated as independent.

For example, a floating gate NAND memory array may utilize a two deck architecture, where each block may be composed of two vertically stacked decks separated by an interfacial region (e.g., a polysilicon plug). In some embodiments, in this physical array architecture, algorithms to program, erase, and read the memory array may be used by the controller so that each deck may operate as an independent block. In this manner, the block size may be effectively reduced by Kx, while the total number of decks in the device may be increased by Kx, for an integer K. In embodiments, K may be 2, 3 or some greater integer. In embodiments, the techniques described herein may allow each deck to operate independently without disturbing the other decks.

In embodiments, a controller for a NAND gate array may include circuitry to provide bias voltages to the memory array, where the memory array comprises two or more decks of memory cells. The controller may further include an output interface coupled to the circuitry and to WLs of the memory array. In embodiments, the circuitry may, in a deck erase operation, apply a first set of bias voltages via the interface to active WLs of a first deck of memory cells to be erased, and apply a second set of bias voltages via the interface to active WLs of one or more other decks of memory cells not to be erased, where the first set of bias voltages (on the memory cells to be erased) may be lower than the second set of bias voltages (on the memory cells not to be erased).

Similarly, in embodiments, the circuitry may, in a deck program operation, apply a first set of bias voltages via the interface to active WLs of a first deck of memory cells to be programmed, and apply a second set of bias voltages via the interface to active WLs of one or more other decks of memory cells not to be programmed, where the first set of bias voltages (on the memory cells to be programmed) is higher than the second set of bias voltages (on the memory cells not to be programmed).

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 is an example apparatus comprising a memory array incorporated with one or more techniques of the present disclosure, in accordance with some embodiments. More specifically, the apparatus may include a memory device 100 with a memory array 102 having stacked planes of memory cells 103 that may be arranged in rows and columns along with lines (e.g., wordlines) 104 and lines (e.g., data lines) 105. Memory device 100 may use lines 104 to access memory cells 103 and lines 105 to exchange information with memory cells 103. Row access circuitry 108 and column access circuitry 109 may respond to an address register 112 to access memory cells 103 based on row address and column address signals on lines 110, 111, or both. A data input/output circuit 114 may be configured to exchange data between memory cells 103 and lines 110.

Circuitry including a control circuit 116 may control operations of device 100 based on signals present on lines 110 and 111. A processing device (e.g., a processor or a memory controller) external to memory device 100 may send different commands 101 (e.g., deck read, write, program verify, erase or command) to memory device 100 using different combinations of signals on lines 110, 111, or both. Control circuit 116 may respond to commands to perform memory operations of accessing a memory cell(s), such as a read operation to read information from memory cells 103 and a write (e.g., programming) operation to store (e.g., program) information into memory cells 103. Control circuit 116 may also perform an erase operation to clear information from some or all of memory cells 103. During various operations, control circuit 116 may cause various memory blocks (groups of memory cells) to be selected or deselected.

Memory device 100 may receive a supply voltage, including supply voltages Vcc and Vss. Supply voltage Vss may operate at a ground potential (e.g., having a value of approximately zero volts). Supply voltage Vcc may include an external voltage supplied to memory device 100 from an external power source such as a battery or alternating current to direct current (AC-DC) converter circuitry. Further, memory device 100 may include a voltage generator 107. Control circuit 116 (or parts thereof) may be configured to cause voltage generator 107 to generate different voltages for use during memory operations of memory device 100. For example, voltages generated by voltage generator 107 may be applied to lines 104 during a deck erase, read or write operation to access memory cells 103. Voltage generator 107 and control circuit 116 (or parts thereof) may be referred to separately or together as circuitry to cause the application of different voltages to components (e.g., lines 104) of memory device 100, including bias voltages for deck operations 120 according to various embodiments of this disclosure. In embodiments, control circuit 116 and voltage generator 107 may be incorporated with techniques of the present disclosure, for example, to provide bias voltages 120 to lines 104 to implement one or more deck operations, as further discussed below.

Memory device 100 may include a non-volatile memory device and memory cells 103 may include non-volatile memory cells, such that memory cells 103 may retain information stored thereon when power (e.g., Vcc, Vss, or both) is disconnected from memory device 100. Each of memory cells 103 may be programmed to store information representing a value of a single bit, or a value of multiple bits such as two, three, four, or another number of bits.

Memory device 100 may be a flash memory device, such as a NAND flash or a NOR flash memory device, or another kind of memory device. Memory device 100 may include a memory array where memory cells 103 may be physically located in multiple levels on the same device, such that some of memory cells 103 may be stacked over some other memory cells 103 in multiple levels over a substrate (e.g., a semiconductor substrate) of memory device 100, forming pillars. One of ordinary skill in the art may recognize that memory device 100 may include other elements, several of which are not shown in FIG. 1, so as not to obscure the example embodiments described herein.

Figure 2:
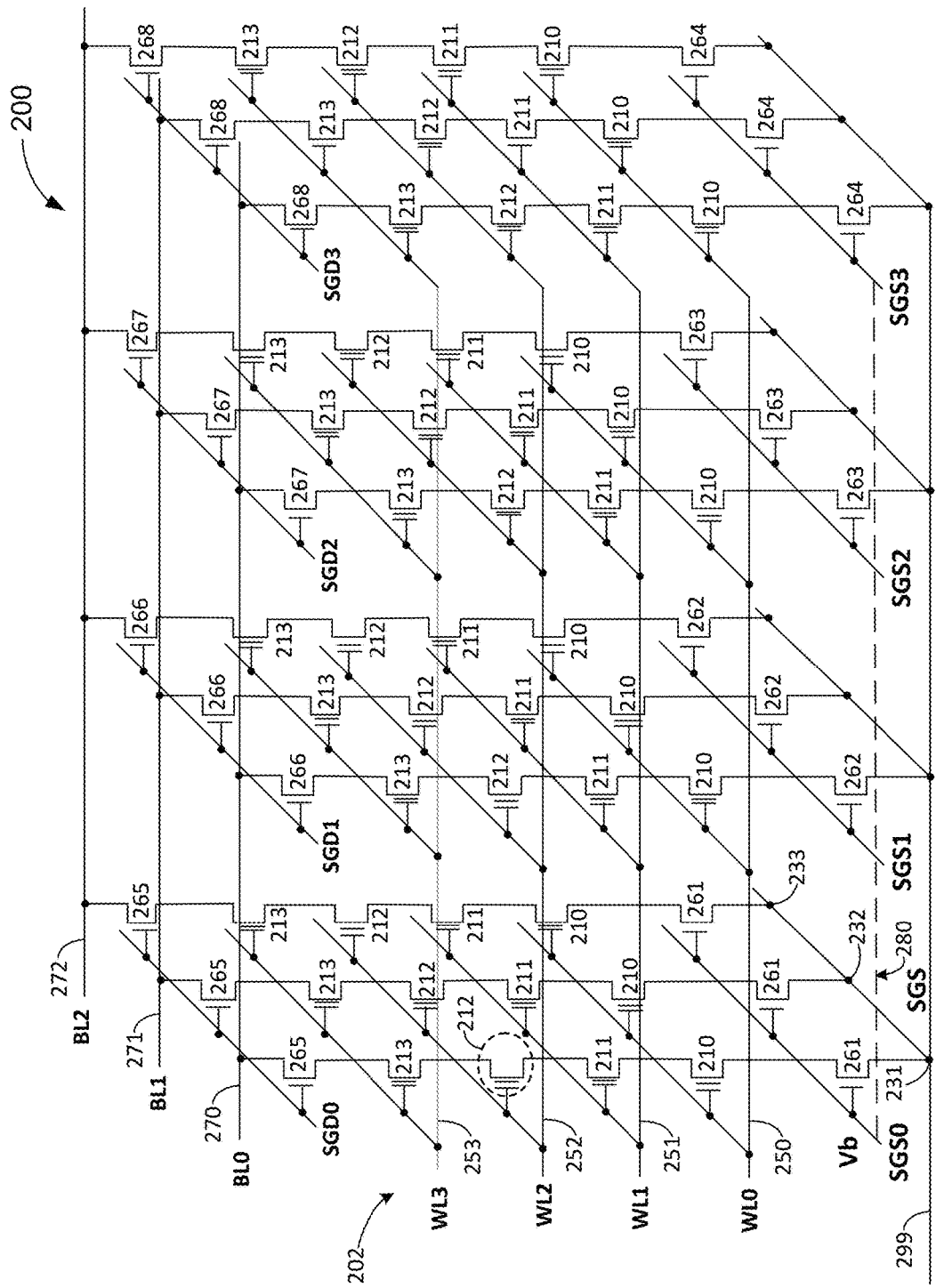
FIG. 2 illustrates an example schematic diagram of a memory array suitable for use with the memory device of FIG. 1, in accordance with various embodiments.

FIG. 2 is an example schematic diagram of an apparatus comprising a memory device 200 with a non-planar memory array 202 suitable for use with memory device 100, in accordance with some embodiments. Memory device 200 may be associated with memory device 100 of FIG. 1, such as forming a portion of memory array 102 of memory device 100. Memory device 200 may include lines (e.g., WLs) 250, 251, 252, and 253 that may carry corresponding signals WL0, WL1, WL2, and WL3, and may form at least part of access lines of memory device 200. Lines 250, 251, 252, and 253 may correspond to lines 104 of FIG. 1. Memory device 200 may include data lines (bitlines) 270, 271, and 272 that carry signals BL0, BL1, and BL2, respectively. Bitlines 270, 271, and 272 may correspond to lines 105 of FIG. 1.

Four lines (access lines or WLs) 250, 251, 252, and 253 and three bitlines 270, 271, and 272 are shown in FIG. 2 as an illustrative example only. The number of these lines may vary. Memory device 200 may include memory cells 210, 211, 212, and 213, and transistors 261, 262, 263, 264, 265, 266, 267, and 268. These memory cells 210, 211, 212, and 213 and transistors 261 through 268 may be arranged in memory cell strings, such as memory cell strings 231, 232, and 233. The memory cells of a given memory cell string may share a common channel region (e.g., pillar). For simplicity, in FIG. 2, only three of the memory cell strings are labeled (231, 232, and 233). The memory array 202 shown in FIG. 2 includes nine memory cell strings and four memory cells 210, 211, 212, and 213 in each memory cell string.

In summary, the example memory array 202 shown in FIG. 2 is provided for illustrative purposes and is not limiting to this disclosure. One skilled in the art will appreciate that the number of access lines, number of memory cell strings (pillars), and number of memory cells in each memory cell string may vary.

Memory cells 210, 211, 212, and 213 may be physically located in multiple levels of memory device 200, such that memory cells 210, 211, 212, and 213 in the same memory cell string may be stacked over each other in multiple levels of memory device 200, forming a pillar. As shown in FIG. 2, transistors 261 through 268 may be controlled (e.g., turned on or turned off) by corresponding signals SGD0, SGD1, SGD2, and SGD3, and SGS0, SGS1, SGS2, and SGS3 provided via corresponding lines as shown to couple the memory cell strings to their respective bitlines 270, 271, and 272, and a line 299, during a memory operation, such as a write operation. In some embodiments, depending on a desired memory array 202 configuration, the lines carrying signals SGS0, SGS1, SGS2, and SGS3 may be connected via a common SGS line 280, as shown.

Line 299 may include a common source line of memory device 200 and may carry a signal, such as signal SL. In a memory operation, such as a write operation, different voltages may be applied to lines 250, 251, 252, and 253 to selectively access memory cells 210, 211, 212, and 213 in order to store information into one or more selected memory cells among memory cells 210, 211, 212, and 213. For example, in a write operation, memory device 200 may select memory cell 212 (shown within a dashed circle) of memory cell string 231 to store information into memory cell 212. In this example, memory device 200 may apply a voltage to line 252 and other voltages to lines 250, 251, and 253. The voltage on lines 250, 251, and 253 may have the same or different values. Memory device 200 may include memory devices and operate using memory operations (e.g., write operations) similar to or identical to memory devices and operations described below with reference to FIG. 3 through FIG. 11. For example, one or more WLs 250, 251, 252, or 253 of the memory device 200 may be separator WLs to separate WLs associated with a first memory block from WLs associated with a second memory block. The one or more separator WLs may be coupled to dummy memory cells that are not used to store data.

In embodiments, the memory array 202 may comprise one or more memory blocks (each having a plurality of memory cells) disposed in a die, such as a NAND die, for example. A memory block may have different memory capacities, depending on technological demand. In operation, such as when a memory array is to be accessed for data erasure, data programming, or data reading, a memory block may be selected (e.g., for erasure, programming, or reading) or deselected, in order to refrain from erasing, programming, or reading deselected blocks while the selected block(s) are being erased, programmed, or read. Accordingly, in a memory array having a plurality of memory blocks, at least one block may be selected for access (e.g., for a program mode or read mode), while other blocks may be deselected in order to refrain from access. Selection and deselection of memory blocks may be accomplished by application of particular voltage values to respective WLs and SGS lines.

As noted above, in embodiments, the logical block size of a memory array may be reduced by Kx compared to standard memory arrays, where K is an integer.

Figure 3:
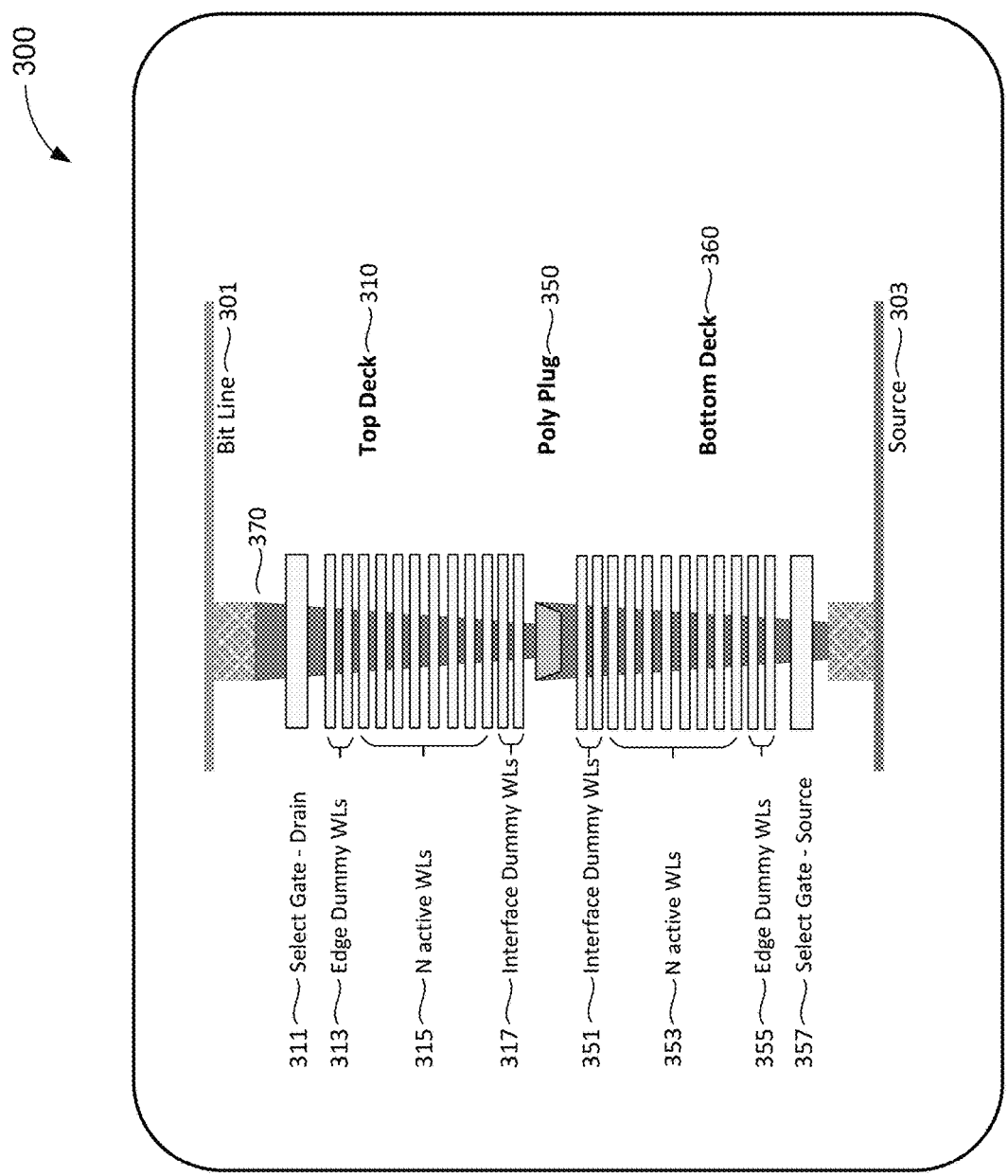
FIG. 3 illustrates an example dual deck array architecture, in accordance with various embodiments.

FIG. 3 illustrates an example floating gate NAND memory array architecture 300 according to various embodiments. With reference thereto, each block of the memory array is comprised of two decks of N active WLs, respectively connected to the active memory cells in the block. The two decks may be electrically connected, for example, by a doped polysilicon (known as "poly") plug, or any other type of suitable connection. As noted below, the poly plug is shown in various figures for purposes of illustration only, and is understood not to be limiting. Thus, beginning at the top of the figure, and focusing on the right side, there is shown bit line connection 301, a top deck 310, a polysilicon plug 350 provided between the top deck and the bottom deck, a bottom deck 360, and source connection 303.

In more detail, focusing on the left side of FIG. 3, there is shown a drain select gate 311, and a set of WLs for top deck 310. These top deck WLs include two edge dummy WLs 313, N active WLs 315, and two interface dummy WLs 317. It is noted that in non-planar memory arrays such as that shown in FIG. 3, the "dummy" WLs are coupled to memory cells that are not used to store data. Similarly, beneath poly plug 350, a set of WLs for bottom deck 360 are also shown. These include two interface dummy WLs 351, N active WLs 353, and two edge dummy WLs 355. As shown, interface dummy WLs are provided on an internal boundary of a deck, here on either side of poly plug 350, and edge dummy WLs are provided adjacent to the select gate for the drain 311 and the select gate for the source 357. The several memory cells may be connected to a central pillar 370, and source and drain select gates at the top and bottom of the block 311, 357, connect pillar 370 to the source 303 and bit 301 lines, respectively.

In embodiments, as noted above, in order to operate each deck as an independent block, erase, program and read algorithms may perform the following processes: (i) erase one deck without disturbing the other decks; (ii) program one deck while the other decks are in various states (programmed, partially-programmed, or erased); (iii) program and erase one deck multiple times without disturbing the other decks; and (iv) read one deck while the other decks are in various states (programmed, partially-programmed, or erased).

It is here noted that the disclosed techniques are applicable to the problem of partitioning any NAND array block into multiple logical independent blocks. In the description to follow, erase, program, and read operations according to various embodiments are described in detail.

It is further noted that while the memory array as illustrated in FIG. 3 is shown as a vertical memory array, where the plurality of memory cells are stacked vertically one above the other, each coupled to a central vertical pillar, this is non-limiting. Therefore, in alternate embodiments, a memory array according to various embodiments may include a plurality of memory cells disposed adjacent to one another horizontally, each coupled to a central horizontal pillar. It is further noted that other aspects of the memory array as illustrated in FIG. 3 are also exemplary, and thus non-limiting. These aspects may include pitch or uniformity of pitch (distance) between memory cells, angular relationship or orientation between memory cells and a central pillar, size of individual memory cells, and uniformity of size of memory cells within a deck or the entire block. Each of these may vary according to various embodiments, and thus none are to be understood as limiting.

Figure 4:
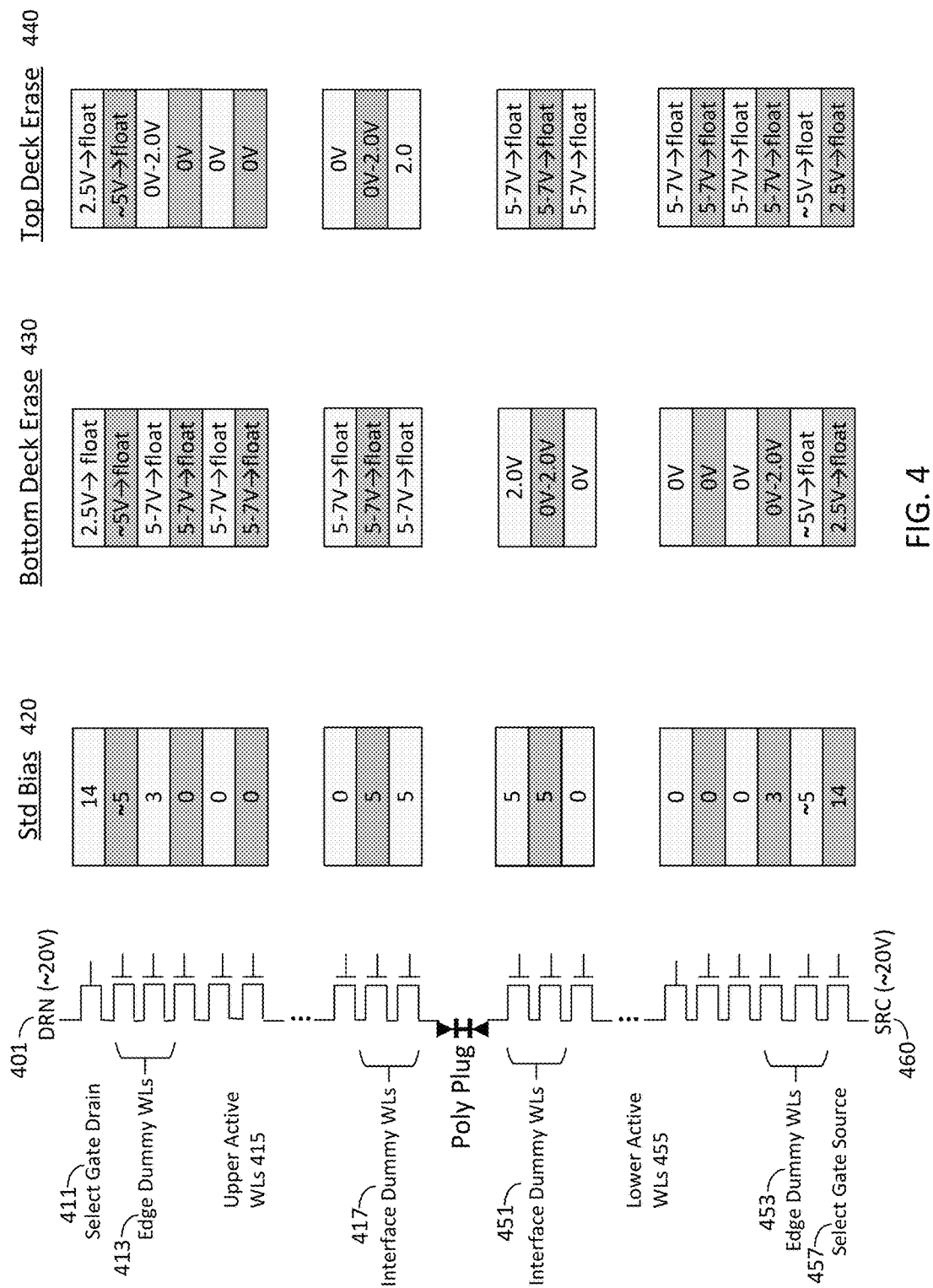
FIG. 4 illustrates bias voltages applied to wordlines (WLs) in a block by deck erase operation, using two decks, in accordance with various embodiments.

FIG. 4 illustrates a biasing scheme that may be used in a two deck example, to erase one deck of the memory array without disturbing the other deck. The index numbers for the select gate source, select gate drain and WLs all have the same final two numerals as their counterparts in FIG. 3, and need not be described further. The three columns may provide example bias voltages to be applied in an erase operation. It is noted that, for easy comparison, the voltage biases in the leftmost column, standard bias 420, are those currently used for a standard full block erase (i.e., erasing the entire memory array at once) and here shown for reference. Those in the middle and rightmost columns are those provided by a controller in accordance with various embodiments.

Figure 11:
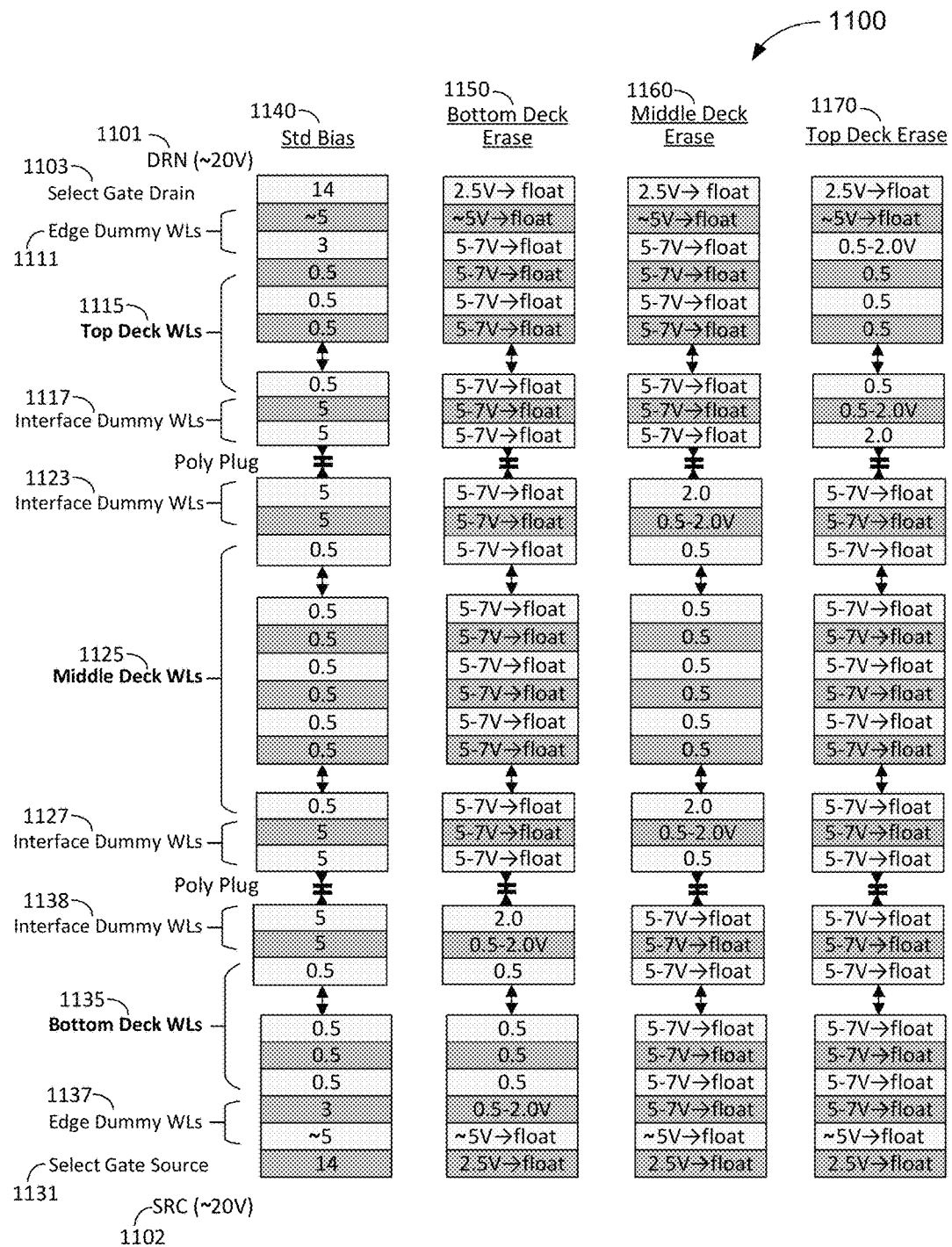
FIG. 11 illustrates bias voltages applied to WLs in a block by deck erase operation, using three decks, in accordance with various embodiments.
Figure 11A:
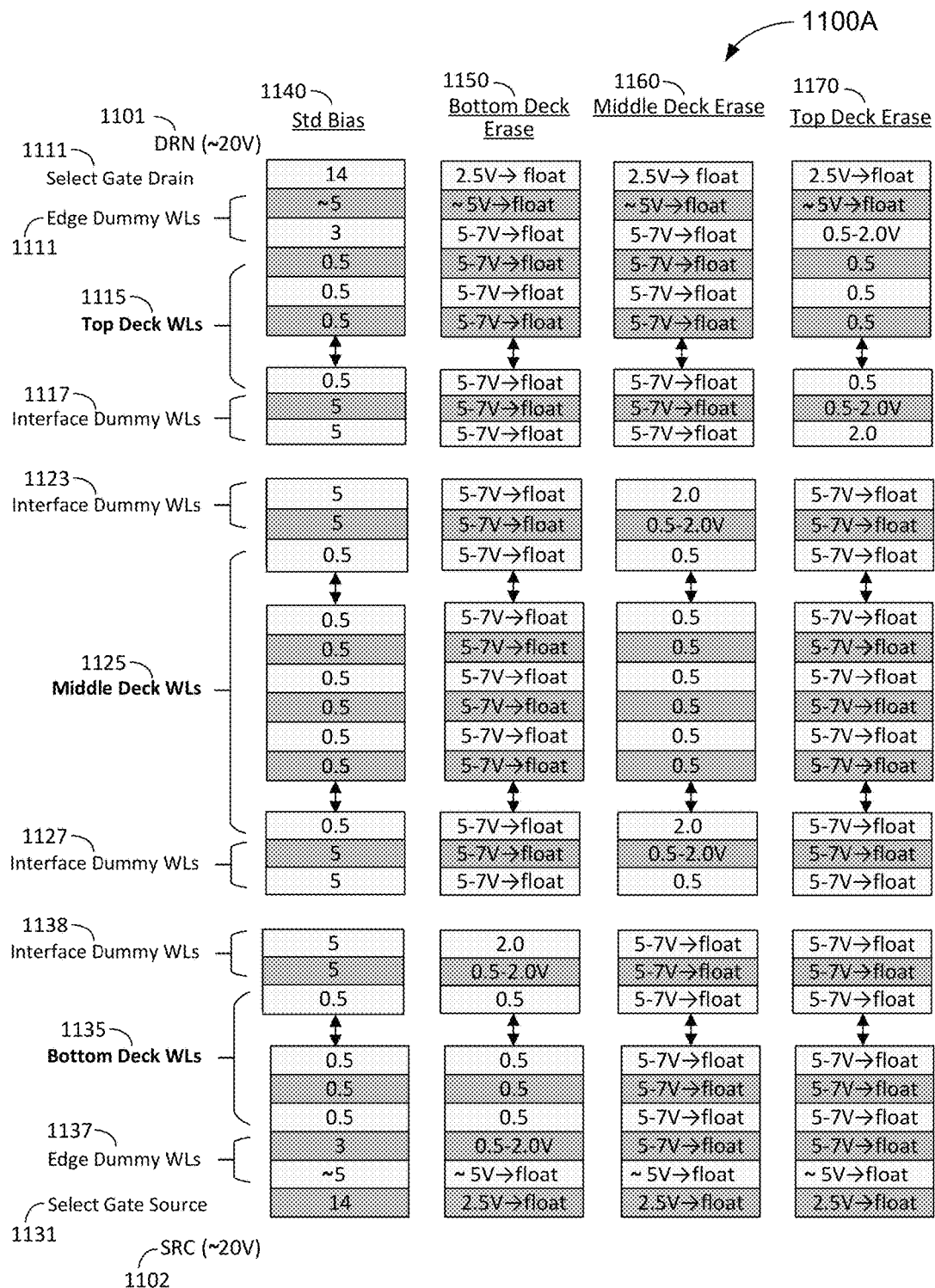
FIG. 11A illustrates a block by deck erase operation as in FIG. 11, for an example memory block without any poly plugs.

Continuing with reference to FIG. 4, middle column bottom deck erase may provide WL biases for erasing just bottom deck 360 of FIG. 3, and rightmost column top deck erase 440 provides WL biases for erasing just top deck 310 of FIG. 3. In embodiments, key points in the proposed erase scheme may be as follows. Active WLs of the selected deck (either bottom or top) use erase biases similar to the standard full block erase scheme. Thus, in this example, biases of 0V may be applied to the active WLs of a deck selected for erasure. In alternate embodiments, such as shown in FIGS. 11 and 11A, 0.5 V may be used for the active WLs of a deck selected for erasure. In embodiments, active WLs of the unselected deck may have erase biases close to the pillar potential (erase inhibit condition). Thus, in FIG. 4, the voltage bias on any active WL of an unselected deck, such as the top deck in column 430, or the bottom deck in column 440, are shown as "5-7V to float."

It is here noted that while example voltages are shown in various figures, and described in the descriptions of those figures, these voltages are exemplary only, and different voltages may be used. Thus, the example voltages provided are understood to be non-limiting.

Finally, as regards the non-active WLs, interfacial dummy WLs 417, 451 may be biased so as to form a graded transition region between the active WLs of the selected and unselected decks (to minimize the WL-WL electric field), and select gates 411 and 457 may use erase biases similar to the standard full block erase scheme, inasmuch as they are allowed to float upwards.

In embodiments, as shown in FIG. 4, all non-zero erase biases on the WLs and select gates 411, 457 may be generated by boot strapping floating nodes to the pillar potential. Alternatively, the biases may be directly applied using a WL driver circuit, as long as they satisfy processes (i) through (iv) described above. In embodiments, WLs of an unselected deck (although in the embodiment of FIG. 4, there is one selected deck and one unselected deck, in general there may be several unselected decks) may be biased or floated to a high enough voltage so as to prevent erase disturb of the programmed cells. This mode of operation uses hole generation from both the source and drain junctions to create the pillar potential. In embodiments, holes may be generated through the process of Gate Induced Barrier Lowering (GIDL) by biasing the select gates to voltages lower than the source and drain voltages.

Continuing with reference to FIG. 4, in embodiments, erase biases on the unselected WLs and the select gates 411, 457 may be generated by boot strapping floating nodes to the pillar. This is shown, for example, in bottom deck erase column 430, where select gate drain 411, edge dummy WLs 413, upper active WLs 415 and interface dummy WLs 417 may all be allowed to float, as shown. As regards interfacial dummy WLs 451, belonging to the selected bottom deck, they may be biased so as to form a graded transition region between the active WLs of the selected and unselected decks. Thus, in this example, their voltage bias may be, for example, between 0V (that of the active WLs of the bottom deck) and 2.0V, as shown, which transitions up to the 5-7V to float that the upper active WLs are biased at. Moreover, in embodiments, the edge dummy WLs of the selected deck may be biased so as to form a graded transition between the select gate and the active WLs. Though not immediately obvious, the bias conditions shown in FIG. 4 do indeed result in a graded transition once the floating gate to floating gate coupling of adjacent WLs is taken into account.

In embodiments, the biases on both the interface dummy WLs and the edge dummy WLs may be either directly applied or generated through bootstrapping (i.e., floating the WL or select gate). Typically, one deck at a time may be erased; however, in embodiments, more than one deck may be erased at the same time. Finally, during an erase verify operation which checks that the threshold voltages of the cells in the erased deck are below a given value, the WLs of all unselected decks may be biased at a voltage above the highest programmed threshold voltage in order to turn on all cells in these decks. It is noted that, in embodiments, floating the unselected WLs is preferable to providing controlled voltages since any offsets between the pillar potential and the WL potential may be thereby eliminated.

Figure 5:
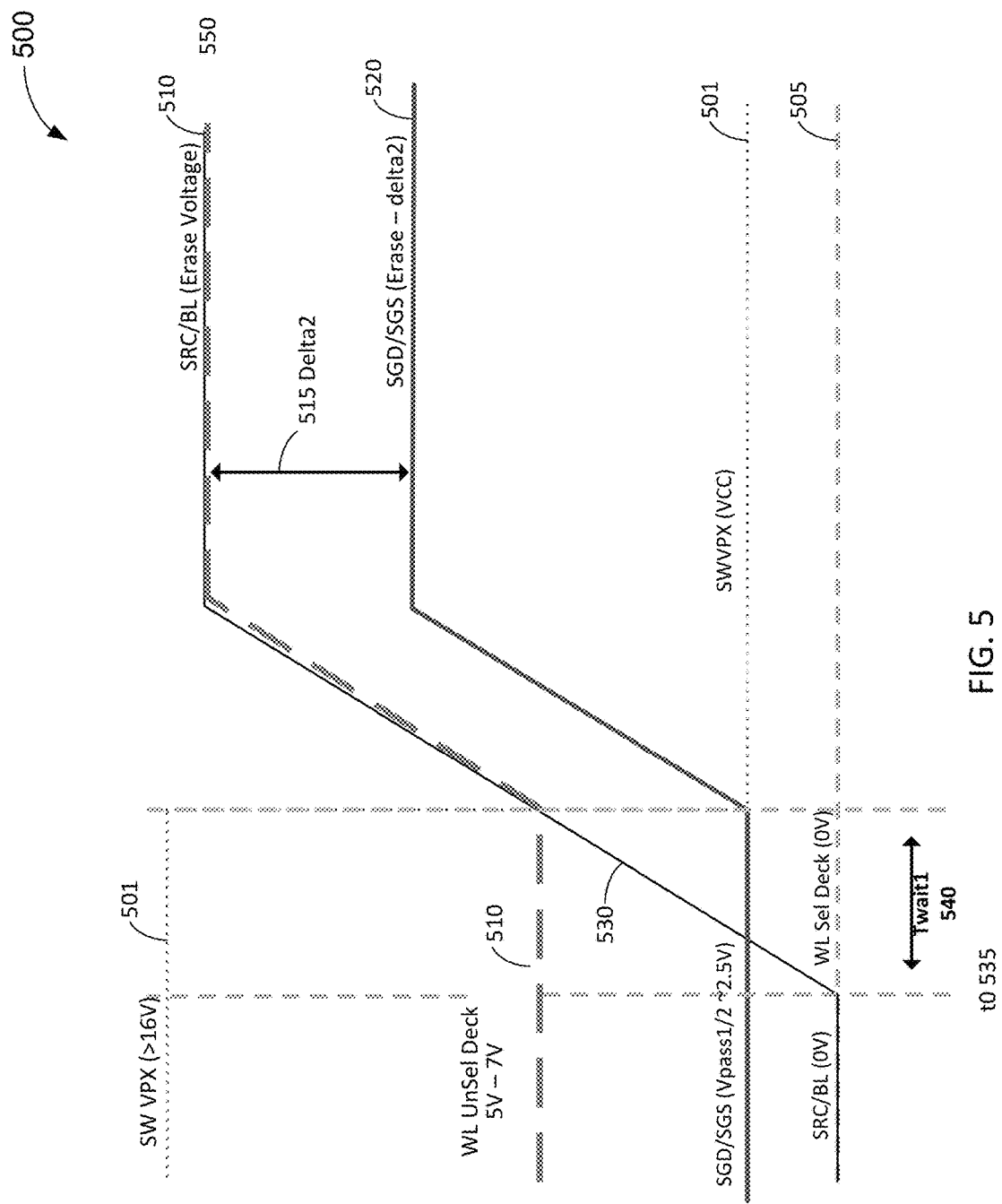
FIG. 5 is a plot of voltages versus time for the deck erase operation illustrated in FIG. 4.

FIG. 5 is a plot 500 of voltages versus time for the example deck erase operation illustrated in FIG. 4. It illustrates the floating of unselected WLs 510 following the initiation of a deck erase. With reference to FIG. 5, at time t0 535, a deck erase operation begins. In embodiments, at time t0 535, the source and bit line voltages 530 begin to rise from 0V to an erase voltage 550. It is here noted that the physical mechanism for the erase is Fowler-Nordheim tunneling which depends only on the difference in potential between the pillar (i.e., Source/Bitline (SRC/BL) voltage 530) and the WL. Since the WL voltage 505 is ~0V, the difference in voltage is just given by the SRC/BL voltage 510. Hence we call this the erase voltage. After a certain waiting time, namely twait1 540, SW VPX (VCC) 501 may drop from >16V to approximately 2.5V, and unselected WLs 510 may also float up to erase voltage 550. At the same time, select gates 520 may float upwards from approximately 2.5V to erase voltage 550 less a value delta2 515, as shown. Meanwhile, WLs of the selected deck may remain at 0V, as shown in FIG. 4. It is further noted that a general principle operative here is that WLs may begin to float when the applied WL voltage is greater or equal to the voltage on the WL switch (SW VPX) 501. Thus, with reference to FIG. 5, when the SW VPX voltage 501 drops from 16V to VCC then all WLs which have applied voltages >=VCC may float. Similarly, all WLs (i.e., those in the selected deck to be erased) with applied voltages <VCC (i.e., 0-0.5V) may not float.

Figure 6:
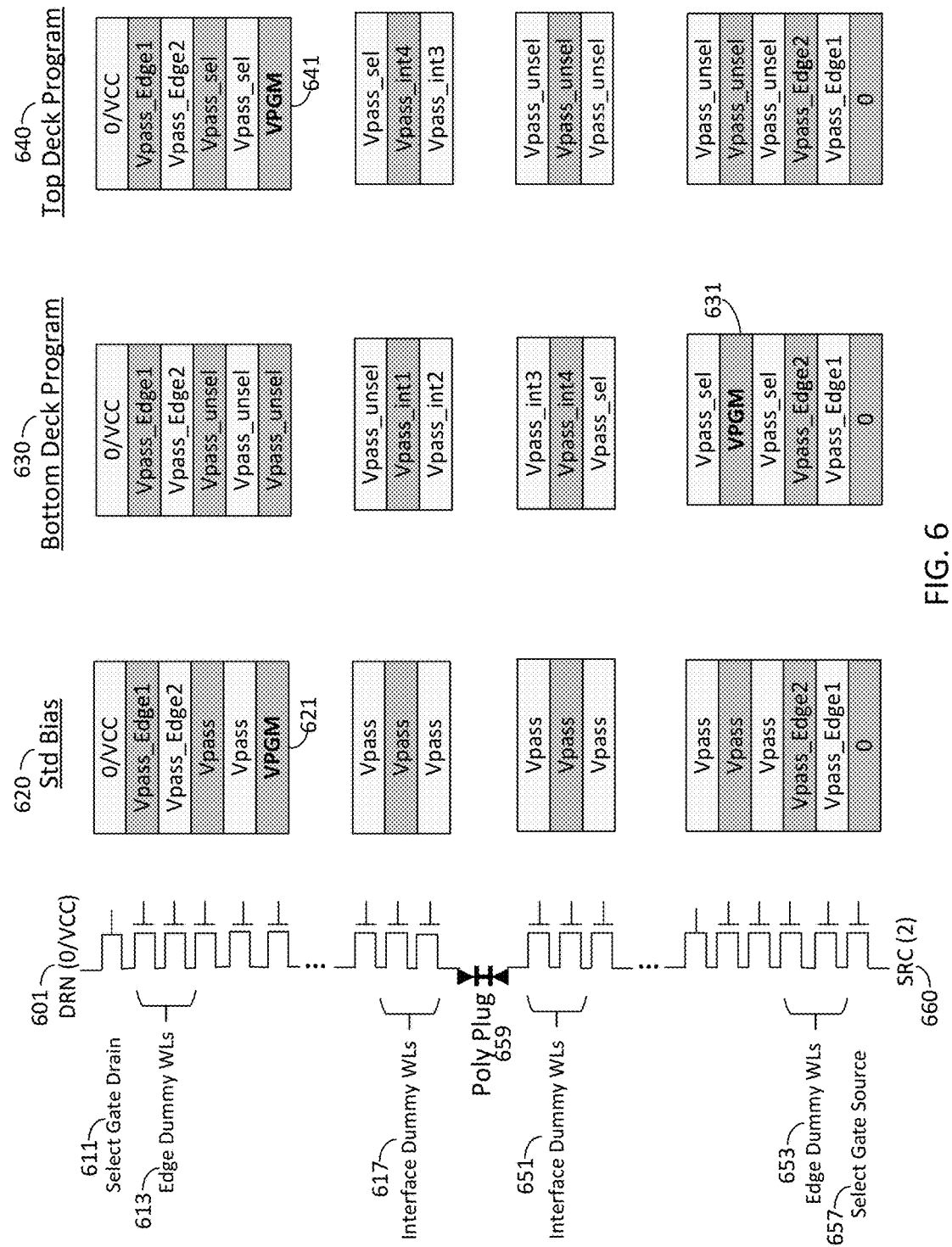
FIG. 6 illustrates bias voltages applied to WLs in a block by deck program operation, using two decks, in accordance with various embodiments.

Next described is a block by deck programming operation, in accordance with various embodiments. FIG. 6 illustrates a biasing scheme used to program one deck of a memory array without disturbing the other decks, in accordance with various embodiments. As above, the particular example of FIG. 6 considers a two deck memory array, where the decks may be separated, for example, by a poly plug. It is here noted however, that in embodiments, there need not be any poly plugs used in the memory array, as it is the interfacial dummy WLs that define where a deck begins and ends, and thus the depiction of poly plugs is understood to be non-limiting. This is described in greater detail below, in connection with FIGS. 11 and 11A, which illustrate deck erase operations on a three deck embodiment of a memory array, with and without poly plugs.

Continuing with reference to FIG. 6, just as in the case of the deck erase operation illustrated in FIG. 4, the voltage biases in the leftmost column 620 are those currently used for a standard full block program operation (shown for reference and comparison), while those in the middle 630 and rightmost 640 columns illustrate deck program operations in accordance with various embodiments. In embodiments, a controller, which may include a control circuit such as control circuit 116 of FIG. 1, may provide or apply the illustrated bias voltages to a memory array, such as, for example, via voltage generator 107 of FIG. 1. In embodiments, the controller may further include circuitry, as well as an interface between the circuitry and WLs of the memory array. Various features of the exemplary block by deck programming scheme of FIG. 6 are next described.

With reference to FIG. 6, in particular columns bottom deck program 630 and top deck program 640, there are shown several voltages, here expressed as variables. These include Vpass_unsel, Vpass_sel, Vpass_int, and Vpass_Edge. In embodiments, Vpass_unsel may be an inhibit voltage for an unselected deck, and Vpass_sel may be an inhibit voltage for the selected deck. In embodiments, in order to reduce inhibit disturb, and to enable multiple program/erase cycles in the selected deck, Vpass_unsel<Vpass_sel. Additionally, in embodiments, Vpass_int>=Vpass_sel to increase the potential in inhibited pillars (i.e., increased pillar boosting).

In embodiments, the programming sequence and/or WL biasing sequence may preferably be optimized to reduce the electron concentration in the pillar before a programming pulse is applied. This may be useful to prevent electrons from being trapped in the pillar and causing program disturb thereby.

In embodiments with two decks, the programming sequence may, for example, progress from poly plug 659 outward towards drain 601, in the case of the top deck program 640, or downwards towards source 660, as in the case of bottom deck program 630. It is noted that in each column, a WL where programming voltage VPGM 621, 631, 641 is applied is bolded, for easy reference. In embodiments, this provides a route for electrons in the pillar to reach the source 660 and drain 601 nodes, thereby satisfying process (iii) above. Alternatively, another method to reduce the electron concentration in the pillar before applying a programming pulse may be to ramp down the un-programmed wordlines before the programmed wordlines at the end of a program verify sequence, thereby providing a path for the electrons in the erased region to reach source 660 and drain 601 nodes. It is noted that, in embodiments, it is important for Vpass_unsel<Vpass_sel in order to enable multiple program/erase cycles in the selected deck without disturbing the unselected deck. In embodiments, for example, Vpass_unsel may be 1-3V lower than Vpass_sel. This is shown, for example, at 710 in FIG. 7, next described.

Figure 7:
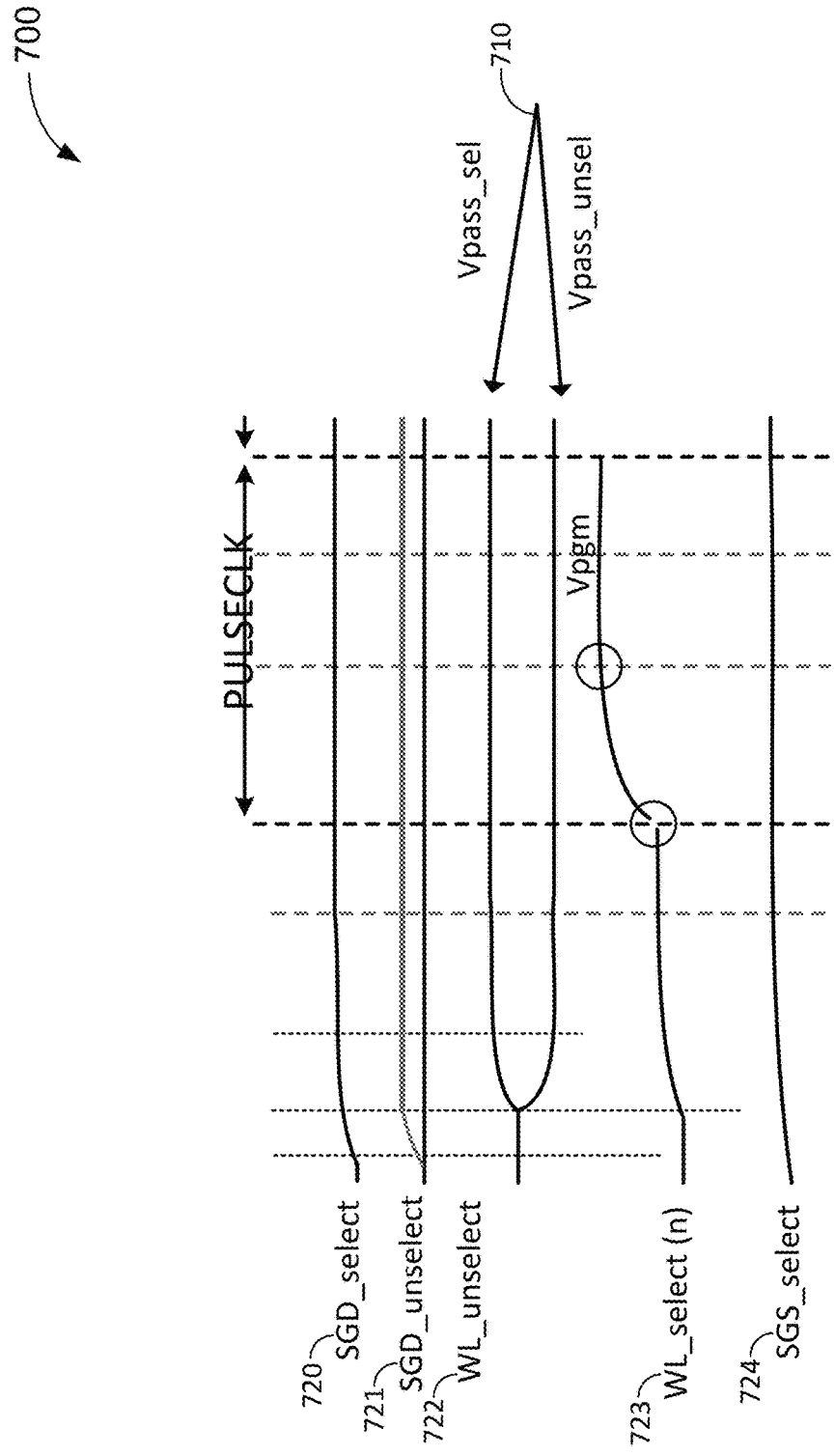
FIG. 7 is a plot of voltages versus time for the deck program operation illustrated in FIG. 6.

FIG. 7 illustrates flow and timing for a deck program operation according to various embodiments. It is here noted that, in embodiments, both standard programming and block by deck programming may use the same flow and timing. Thus, standard voltages 720-724 are not described further. However, in embodiments, in a block by deck programming operation according to various embodiments, WLs in the unselected deck may be biased at a lower voltage, Vpass_unsel, than the unselected WLs in the selected deck, Vpass_sel, as noted above, and as shown at 710.

Moreover, in embodiments, the order in which WLs may be programmed is different than the standard block program case. It is here noted that a standard block programming sequence starts from the source and progresses towards the drain (bottom to top of the figure in FIG. 6). In an embodiment having a dual deck architecture, programming may start at poly plug 659 (or, in embodiments without a poly plug, at a center between the respective interfacial WLs of the two decks) and progress upwards to the drain (for the top deck), and then return to poly plug 659 and progress downwards towards the source (for the bottom deck). In embodiments, this sequence may be used so that electrons in the pillar always have a discharge path as the WL voltages are ramped down after a program verify operation. In alternate embodiments with multiple decks, and thus with one or more internal decks, a different program sequence may be used, as described below.

Figure 8:
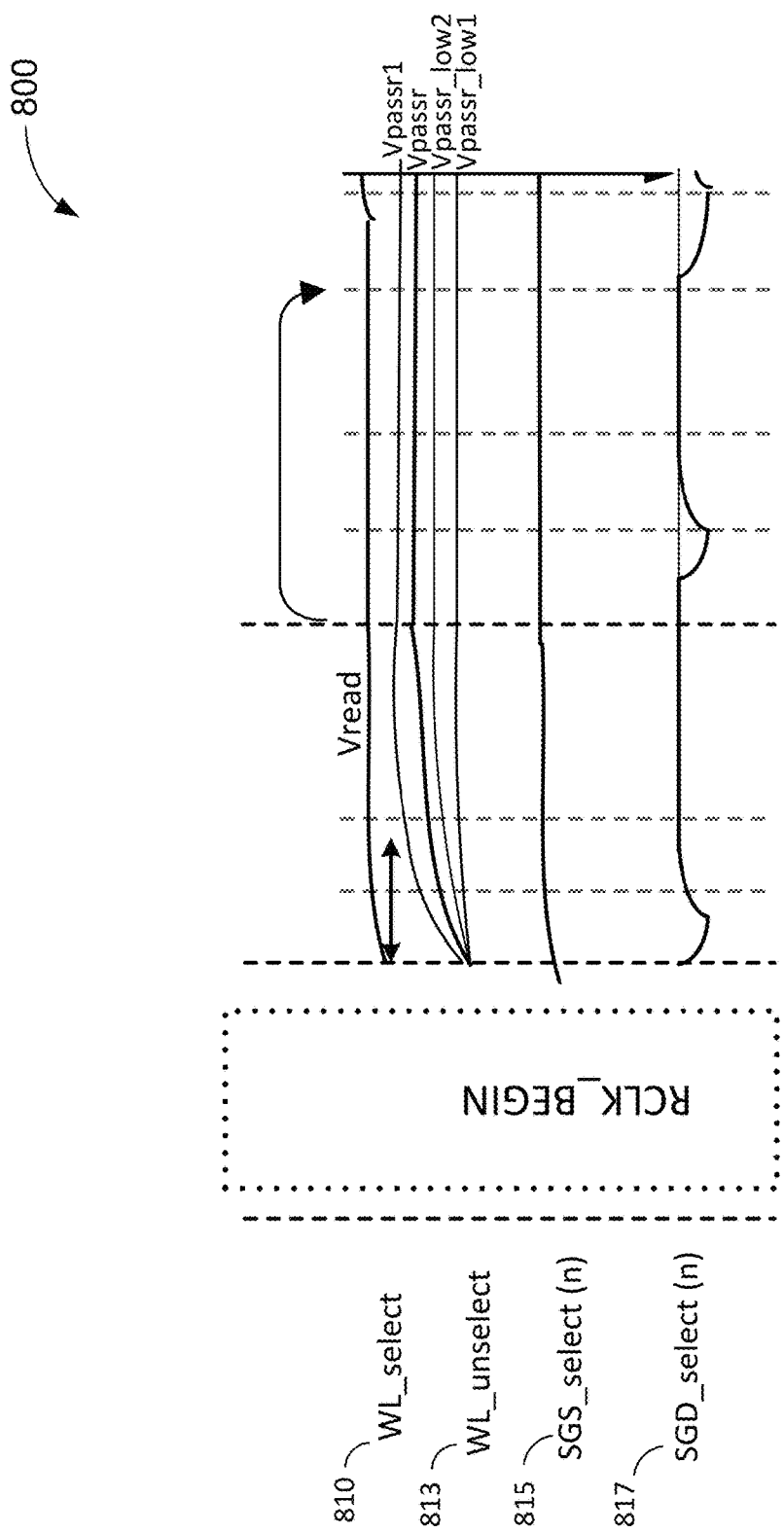
FIG. 8 is a plot of voltages versus time for a block by deck read and verify operation, in accordance with various embodiments.
Figure 9:
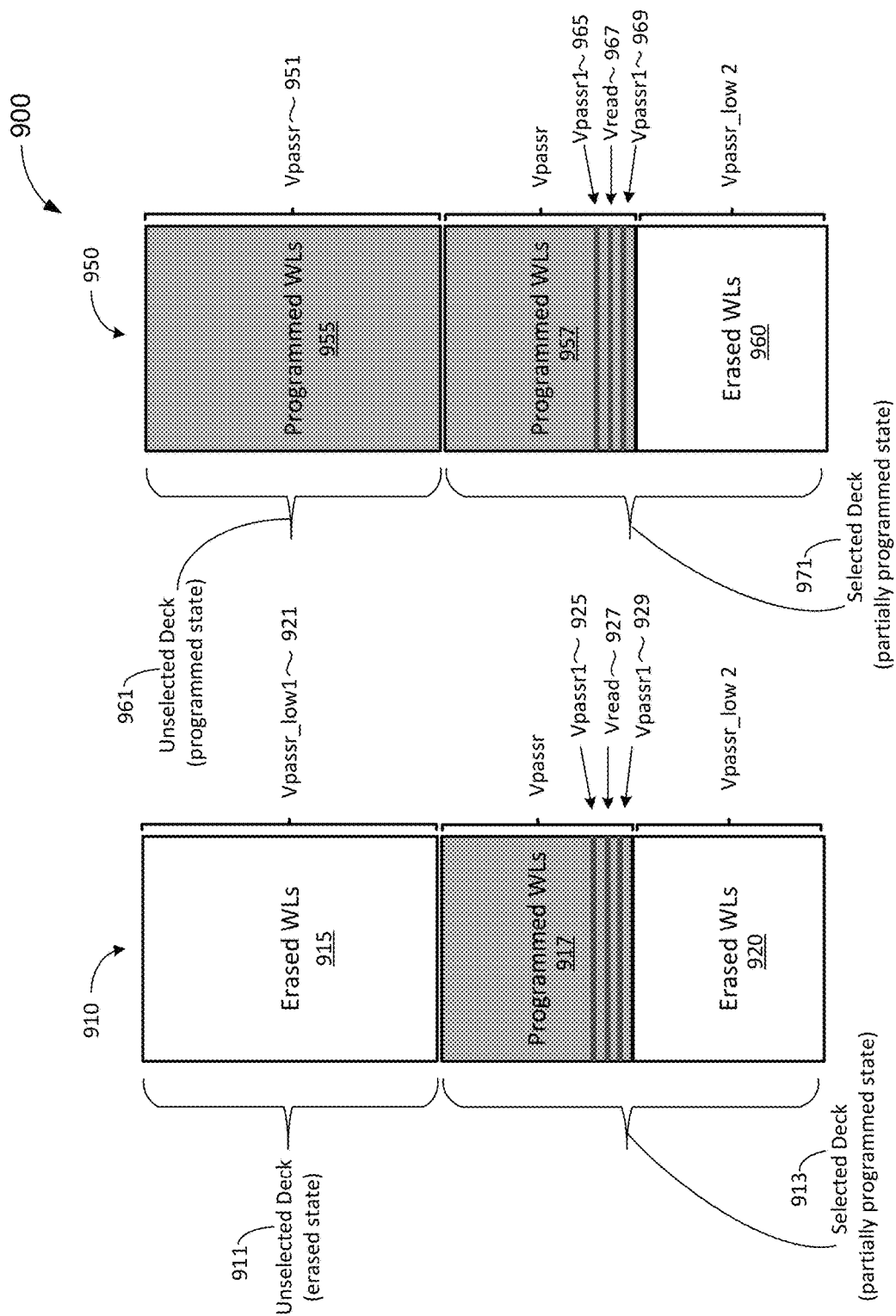
FIG. 9 illustrates differences between a read operation and program verify operation as a function of whether the unselected deck is in an erased state, in accordance with various embodiments.

FIG. 8 illustrates a flow and timing for a deck read and verify operation in accordance with various embodiments. It is here noted that, in embodiments, a block by deck read/verify operation may use the same flow and timing as used in a standard read/verify operation. In embodiments, in a block by deck read/verify, the WL bias voltage for the unselected decks may depend upon whether the unselected deck is in a programmed or erased state. This is illustrated in FIG. 9, described below. Thus, as shown in FIG. 8, the selected WL of the selected deck, WL_select 810, has voltage Vread. The unselected WLs, both in the selected deck, i.e., those not currently being read in the read verify operation, and those in the unselected deck or decks, WL_unselect 813, may either have Vpassr, Vpassr1, Vpassr_low1, or Vpassr_low2, as illustrated in FIG. 9. As shown in FIG. 8, Vpassr1 has the highest voltage, followed by Vpassr, then followed by Vpassr_low2, and finally, the lowest voltage of the WL_unselect voltages is Vpassr_low1. Standard voltages 815 and 817 are not described further.

Thus, in embodiments, the WL voltage for the unselected deck may equal Vpassr when the WLs are in the programmed state and Vpassr_low1 when the WLs are in the erased state. This is illustrated in FIG. 9, next described. In embodiments, Vpassr_low1 may typically be a few volts lower than Vpassr in order to maintain a similar resistance in the unselected deck when it is in the erased or programmed state. It is here noted that, in embodiments, the values of Vpassr1 and Vpassr_low2 do not depend on the state of the unselected deck, and may be chosen in order to maximize the array reliability. It is further noted that, in embodiments, for a read and verify operation there is no difference between the dual deck case and the case where the number of decks>2, such as is illustrated, for example, in FIG. 13 and in FIG. 13A.

FIG. 9 thus illustrates differences between a read operation and a program verify operation as a function of whether the unselected deck is in an erased state or a programmed state, in accordance with various embodiments. With reference thereto, there are shown two example memory blocks, 910 and 950, each having two decks, according to various embodiments. A deck read and program verify operation is shown as occurring within each of memory blocks 910 and 950, and in each case, on the lower deck of the memory block. Thus, in memory block 910, unselected upper deck 911 is in an erased state, having erased WLs 915, and selected lower deck 913 is in a partially programmed state, with WLs 917 being programmed, and WLs 920 being erased. Similarly, in memory block 950, unselected upper deck 961 is in an erased state, having programmed WLs 955, and selected lower deck 971 is in a partially programmed state, with WLs 957 being programmed, and WLs 960 being erased. Thus, the only difference between the two memory blocks is the state of the unselected upper decks 911 and 961.

Continuing with reference to diagram 900 of FIG. 9, in embodiments, for each of selected (lower) decks 913 and 971, a voltage bias of Vpassr_low 2 may be applied to the erased WLs 920 and 960, respectively. Similarly, in embodiments, to the programmed WLs 917 and 957, respectively, of selected decks 913 and 971, in general, a voltage bias of Vpassr may be applied. However, as an individual WL of the programmed WLs is read and verified, to that WL being then read and verified, as shown at WLs 927 and 967, respectively, a voltage bias of Vread may be applied, and to each WL adjacent to the WL then being read and verified, a voltage bias of Vpassr1 may be applied, as shown at WLs 925 and 929 of selected deck 913, and WLs 965 and 969 of selected deck 971. As is illustrated in FIG. 8, described above, Vread>Vpassr1>Vpassr>Vpassr_low2>Vpasr_low1.

Finally, as to the unselected deck in each case, in a deck read and program verify operation, the bias voltage applied to an unselected deck depends upon whether or not the unselected deck has been previously programmed, and is now in a programmed state, or is currently erased. In the former case, as shown, for example, in erased WLs 915, a voltage of Vpassr_low1 921 may be applied. Alternatively, when the unselected deck is in a programmed state, as shown in programmed WLs 955, the same voltage applied to programmed WLs of a selected deck, namely Vpassr, may be applied, as shown at Vpassr 951.

FIGS. 10 through 14 illustrate example block by deck operations for a memory array divided into three decks. The block by deck operations for these embodiments expand upon those discussed above, in connection with a two deck embodiment. FIGS. 10 through 14 illustrate how, in embodiments, a given memory block may be divided into multiple logical decks, and thus more than three decks are also understood, three decks being shown in FIGS. 10-14 being merely exemplary.

Figure 10:
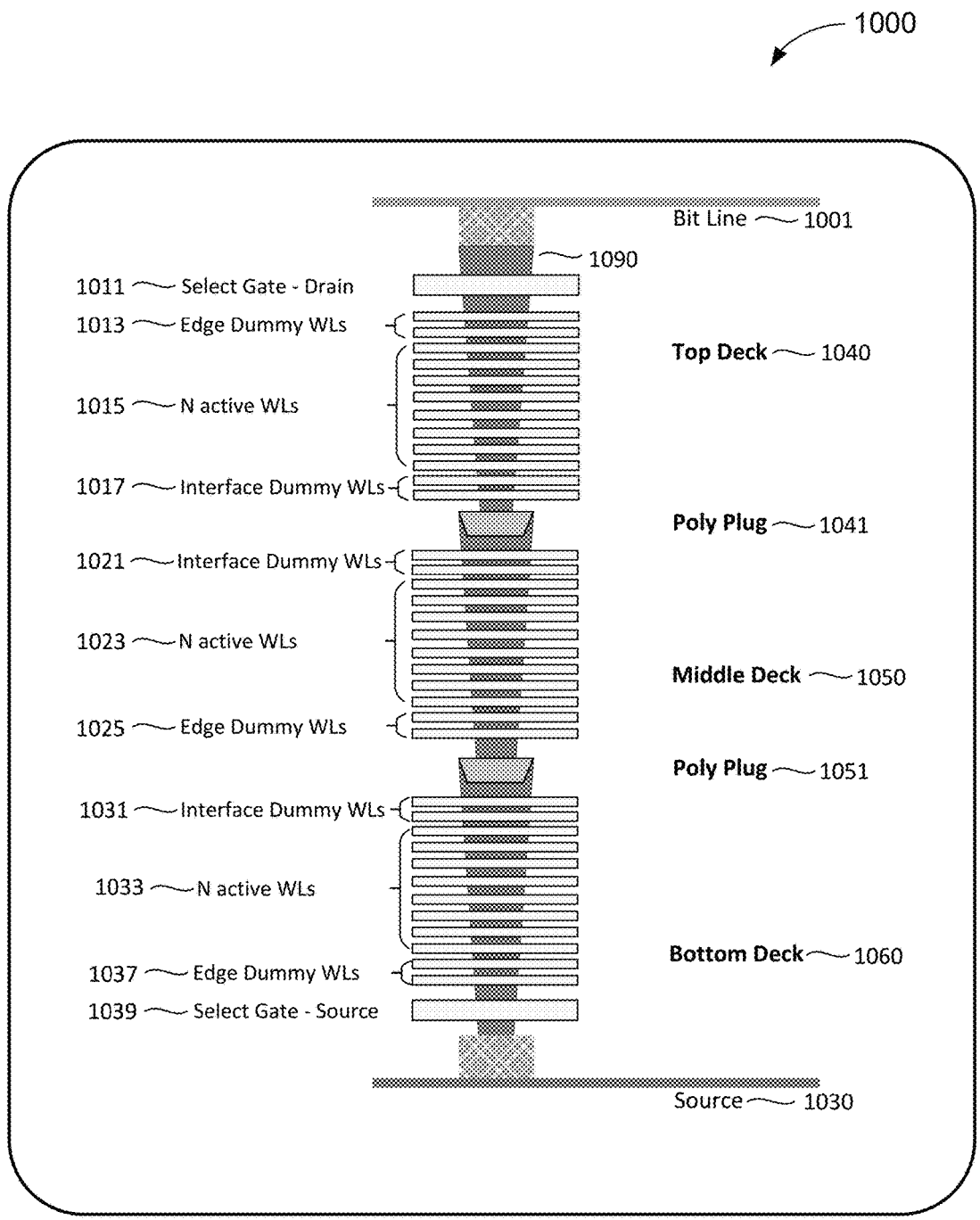
FIG. 10 illustrates an example three deck array architecture, in accordance with various embodiments.

FIG. 10 thus shows a floating gate NAND array architecture 1000 according to various embodiments. With reference thereto, each block is comprised of three decks of N active WLs, respectively connected to the active memory cells in the block. These include top deck 1040, middle deck 1050, and bottom deck 1060. The three decks are electrically connected by two doped polysilicon (known as "poly") plugs 1041 and 1051. Thus, beginning at the top of the figure, and focusing on the right side, there is shown bit line connection 1001, a top deck 1040, a polysilicon plug 1041 provided between the top deck and the middle deck, middle deck 1050, a polysilicon plug 1051 provided between middle deck 1050 and bottom deck 1060, bottom deck 1060, and source connection 1030.

In more detail, focusing on the left side of FIG. 10, there is shown a drain select gate 1011, and a set of WLs for top deck 1040. These top deck WLs include two edge dummy WLs 1013, N active WLs 1015, and two interface dummy WLs 1017. As noted above, in memory arrays the "dummy" WLs are coupled to memory cells that are not used to store data. Similarly, beneath poly plug 1041, a set of WLs for middle deck 1050 are also shown. These include two interface dummy WLs 1021, N active WLs 1023, and two edge dummy WLs 1025. As shown, interface dummy WLs are provided on an internal boundary of a deck, here on either side of poly plug 1051. Beneath poly plug 1051, a set of WLs for bottom deck 1060 are also shown. These include two interface dummy WLs 1031, N active WLs 1033, and two edge dummy WLs 1037. As noted, interface dummy WLs are provided on an internal boundary of a deck, here on either side of poly plug 1051, and edge dummy WLs are provided adjacent to the drain select gate 1011 as well as source select gate 1039. The several memory cells are connected to a central pillar 1090, and source and drain select gates at the top and bottom of the block 1011, 1039 connect pillar 1090 to bit line 1001 and source 1030, respectively.

As in the two deck case described above, in embodiments, a deck erase operation is to erase one deck without disturbing the other decks. Similarly a deck program operation is to program one deck while the other decks are in various states (programmed, partially programmed, erased), or to program and erase one deck multiple times without disturbing the other decks. Finally, a deck read operation is to read one deck while the other decks are in various states, e.g., programmed, partially programmed, or erased.

FIG. 11 illustrates a block by deck erase operation for a memory block with three decks, such as, for example, memory block 1000 of FIG. 10. FIG. 11 shows three columns of example bias voltages, for the respective cases of bottom deck erase 1150, middle deck erase 1160, and top deck erase 1170. It is noted that, for easy comparison, the voltage biases in the leftmost column, standard bias 1140, are those currently used for a standard full block erase (i.e., erasing the entire memory array at once) and here shown for reference. Those in the three columns to the right are those that may be provided by a controller in accordance with various embodiments. Additionally, at the far left of the figure, FIG. 11 shows drain 1101, select gate drain 1103, top deck edge dummy WLs 1111, top deck WLs 1115, interface dummy WLs 1117 and a poly plug at the lower boundary of the top deck. FIG. 11 further shows middle deck interface dummy WLs 1123, middle deck WLs 1125, interface dummy WLs 1127 and a poly plug at the lower boundary of the middle deck. Finally, FIG. 11 shows bottom deck interface dummy WLs 1138, bottom deck WLs 1135, edge dummy WLs 1137, and at the lower boundary of the bottom deck, select gate source 1131 and source 1102.

Continuing further with reference to FIG. 11, bottom deck erase 1150 provides WL biases for erasing just bottom deck 1060 of FIG. 10, middle deck erase 1160 provides WL biases for erasing just middle deck 1050 of FIG. 10, and rightmost column top deck erase 1170 provides WL biases for erasing just top deck 1040 of FIG. 10. In embodiments, key points in the proposed erase scheme may be as follows. Active WLs of a selected deck may use erase biases similar to the standard full block erase scheme. Thus, in this example, biases of 0.5 V may be applied to the active WLs of a deck selected for erasure, and active WLs of the unselected decks may have erase biases close to the pillar potential (erase inhibit condition). Thus, in FIG. 11, the voltage bias on any active WL of an unselected deck, such as the top and middle decks in column 1150, or the top and bottom decks in column 1160, for example, are shown as "5-7V to float."

Finally, as regards the non-active WLs, in embodiments, interfacial dummy WLs 1117 and 1123, or interfacial dummy WLs 1127 and 1138, may be biased so as to form a graded transition region between the active WLs of selected and unselected decks (to minimize the WL-WL electric field). Thus, in this example, their voltage bias may be between 0.5V (that of the active WLs of a selected deck) and 2.0V, as shown, which transitions up to the 5-7V to float that active WLs of an unselected deck are biased at. This is shown in interface dummy WLs 1138 of bottom deck erase 1150, interface dummy WLs 1123 of middle deck erase 1160, and finally, interface dummy WLs 1117 of top deck erase 1170. Finally, as in the two deck case described above, select gates 1103 and 1131 may be biased in similar fashion to the standard full block erase scheme, inasmuch as they are allowed to float upwards.

In embodiments, as shown in FIG. 11, all non-zero erase biases on the WLs and select gates may be generated by boot strapping floating nodes to the pillar potential. Alternatively, in other embodiments, the biases may be directly applied using a WL driver circuit, as long as they satisfy processes (i) through (iv) described above. In embodiments, WLs of an unselected deck may be biased or floated to a high enough voltage so as to prevent erase disturb of the programmed cells, but low enough to allow the erase voltage to pass from the source 1102 and drain 1101 through the pillar. This mode of operation enables hole generation from both the source 1102 and drain 1101 junctions to equalize the pillar potential.

As noted above in connection with FIG. 4, in embodiments, erase biases on unselected WLs and select gates 1111, 1131 may be applied by boot strapping floating nodes to the pillar. Moreover, as noted, interfacial dummy WLs may be biased so as to form a graded transition region between the active WLs of selected and unselected decks. It is here noted, however, that when both decks on either side of a poly plug (or logical deck division, as in the case of FIG. 11A) are unselected decks, as in the case of top and middle decks in bottom deck erase 1150, for example, or middle and bottom decks in top deck erase 1170, in embodiments, no such interfacial dummy WL graded region is required, as shown for interface dummy WLs 1117 and 1127, respectively. Or, for example, if both decks on either side of the plug are selected, then the dummy WLs adjacent to that plug may be biased in the same manner as the selected decks, and in this situation as well, no graded region is required.

In embodiments, edge dummy WLs 1111 and 1137 may be biased so as to form a graded transition region between the select gates and the active WLs, when applicable, as in the case of edge dummy WLs 1137 in bottom deck erase 1150, or edge dummy WLs 1111 in top deck erase 1170, as shown. Because in middle deck erase 1160 no edge decks are selected for erasure, no such edge dummy WL gradient is needed, as shown. In embodiments, biases on both interface and edge dummy WLs may be either directly applied or generated through bootstrapping. In one embodiment, all bias voltages <Vcc may be directly applied while biases >Vcc may be generated through bootstrapping (i.e., floating the WL or select gate). Typically, one deck at a time is erased; however, in embodiments (not shown), more than one deck may be erased at the same time. During erase verify, the WLs of all unselected decks may be biased at a high voltage in order to turn on the programmed cells in each of these decks.

FIG. 11A illustrates a block by deck erase operation as in FIG. 11, for an example memory block without any poly plugs. The voltage biases are the same as shown and described in FIG. 11, and that description need not be repeated again. As noted, in embodiments, poly plugs are not required to define the decks, but rather the interfacial dummy WLs are, as shown in FIG. 11A. In this case, just as in the case of FIG. 11, biases on the interfacial WLs may be chosen to create a graded transition region between the selected and unselected decks. Thus, in embodiments, the minimum number of interface dummy WLs may be determined based on the transition region voltage grading required, in addition to considerations such as pillar uniformity in the active WLs, which are present even in the standard operating conditions. Finally, in embodiments, it is possible to have a mixed architecture where both poly plugs and interface WLs may be used in some cases, and only interface WLs used in other cases, in the same memory array.

Figure 12:
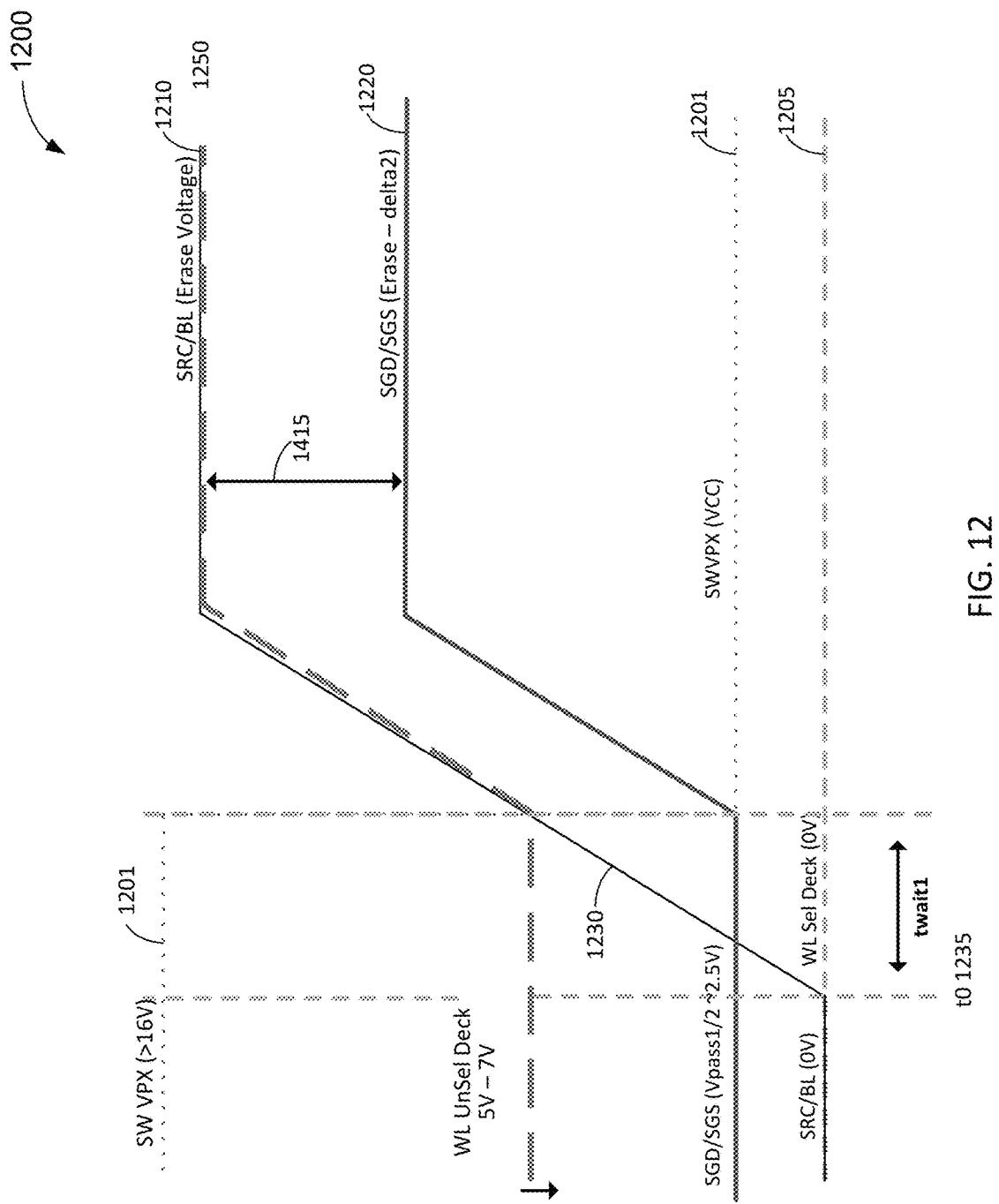
FIG. 12 is a plot of voltages versus time for the deck erase operation illustrated in FIG. 11.

FIG. 12 is a plot of voltages versus time for the example deck erase operation illustrated in FIG. 11. The plot shown in FIG. 12 is the same as that of FIG. 5, described above, and, as a result, its description need not be repeated again here.

Figure 13:
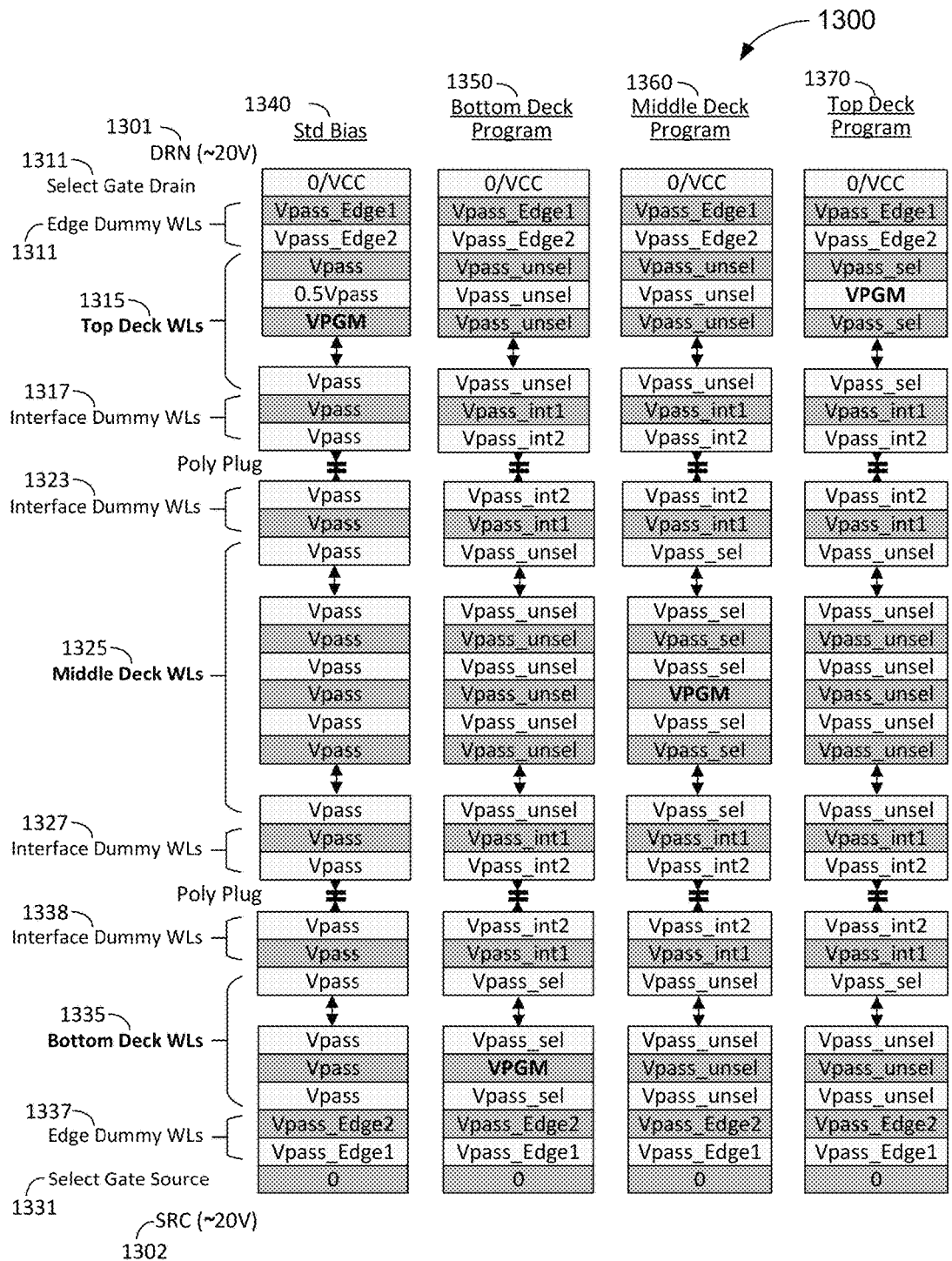
FIG. 13 illustrates bias voltages applied to WLs in a block by deck program operation, using three decks, in accordance with various embodiments.

FIG. 13 illustrates a block by deck program operation for a memory block with three decks. The deck program operations illustrated for a multiple deck case, as shown in FIG. 13, are wholly analogous to those illustrated in FIG. 6 and described above, and the three cases of bottom deck program 1350, middle deck program 1360, and top deck program 1370 operate on a three deck memory array as shown in FIG. 10, and further described, in the context of deck erase operations, in connection with FIG. 11. Thus, for ease of description, the basic features of block program operations, and the voltage biases applied to the various WLs of selected and unselected decks, as described in connection with FIG. 6 need not be repeated. However, there are some differences and complexities when dealing with a multiple deck embodiment, and these are next described.

It is here noted that when the number of decks in an exemplary memory array is >2, there will always be intermediate decks that are not adjacent to either the source or drain. In such cases, in a deck program operation, simply programming from a poly plug outward towards an edge is insufficient to provide the electrons in the pillar with a discharge path as the WL voltages are lowered after a program verify operation. In the case that, for example, in a three deck embodiment, if both the top deck and the bottom deck are programmed, there will be no discharge path for electrons in the middle deck. Thus, in embodiments, in order to enable a discharge path for the electrons in the middle deck, either (1) a policy must be put in place which prevents programming the middle deck while both the top and bottom decks are programmed, or (2) the WLs of the middle deck are lowered after program verify to a value typically between ground and Vcc, while the WLs of the top and bottom decks are held high, to a value near Vpassr, to keep the discharge path open. Afterwards, the WLs of the top and bottom decks are also lowered to a value typically between ground and Vcc. In general, the WLs of the select deck need to be lowered first and afterwards the WLs of the unselected deck can be lowered. In embodiments, this approach is required for decks>2, unless a policy similar to the one described above is used, but can also be used for the dual deck case. As in the dual deck case, a critical enabler for this to work is that the Vpass_unsel<Vpass_sel in order to enable multiple program/erase cycles in the selected deck without disturbing the unselected decks.

Figure 13A:
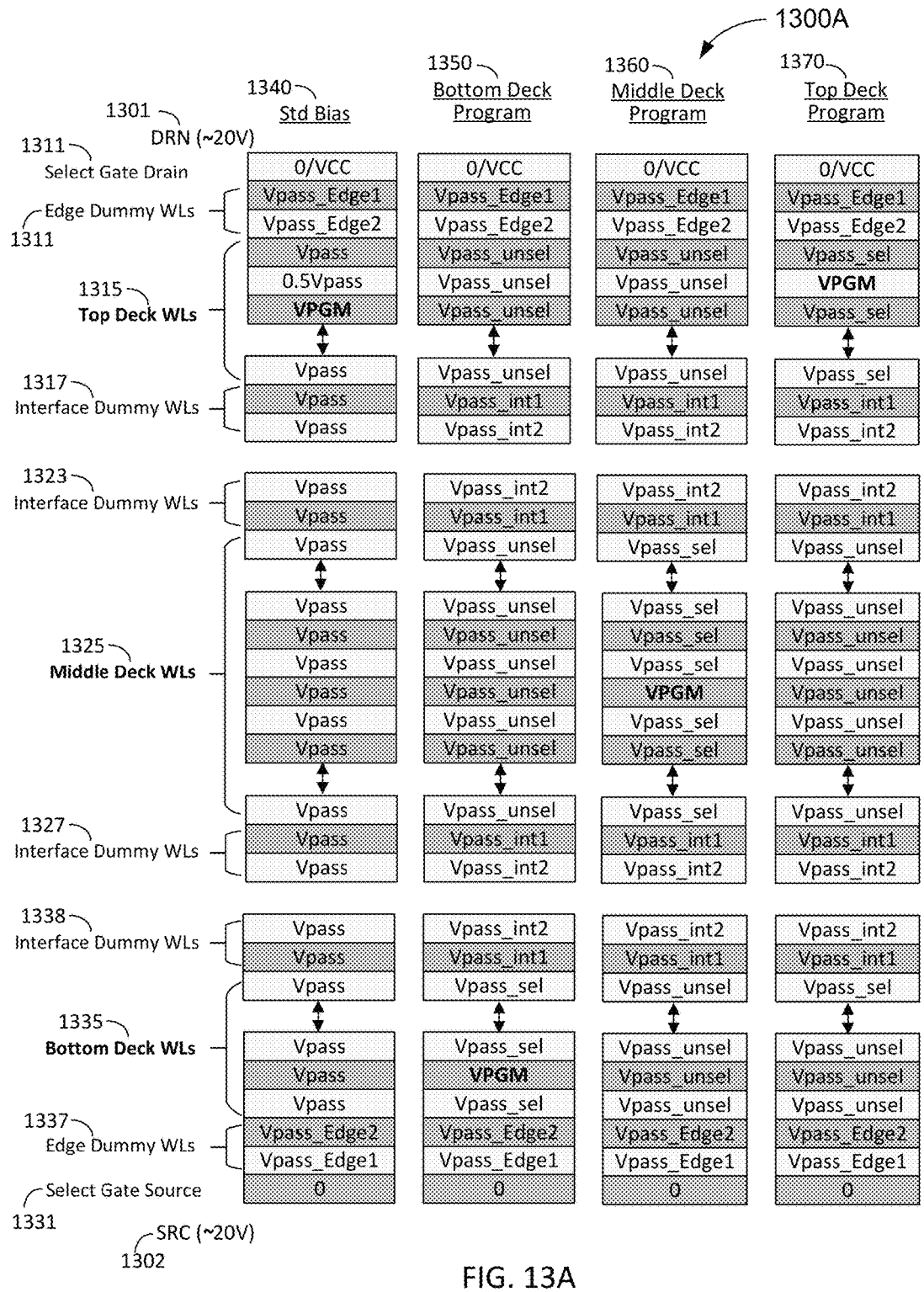
FIG. 13A illustrates a block by deck program operation as in FIG. 13, for an example memory block without any poly plugs.

FIG. 13A illustrates a block by deck program operation as in FIG. 13, for an example memory block without any poly plugs. The voltage biases are the same as shown and described in FIG. 13, and that description need not be repeated again.

It is noted that flow and timing for the multiple deck programming case (such as shown in FIGS. 13 and 13A) are, in embodiments, identical to flow and timing for the two deck programming case, as described above in connection with FIG. 7. As noted above in connection with FIG. 8, both standard programming and block by deck programming may use the same timing and flow in a deck programming operation, and therefore the description of FIG. 8 is also applicable to the multiple deck case of FIGS. 13 and 13A.

Figure 14:
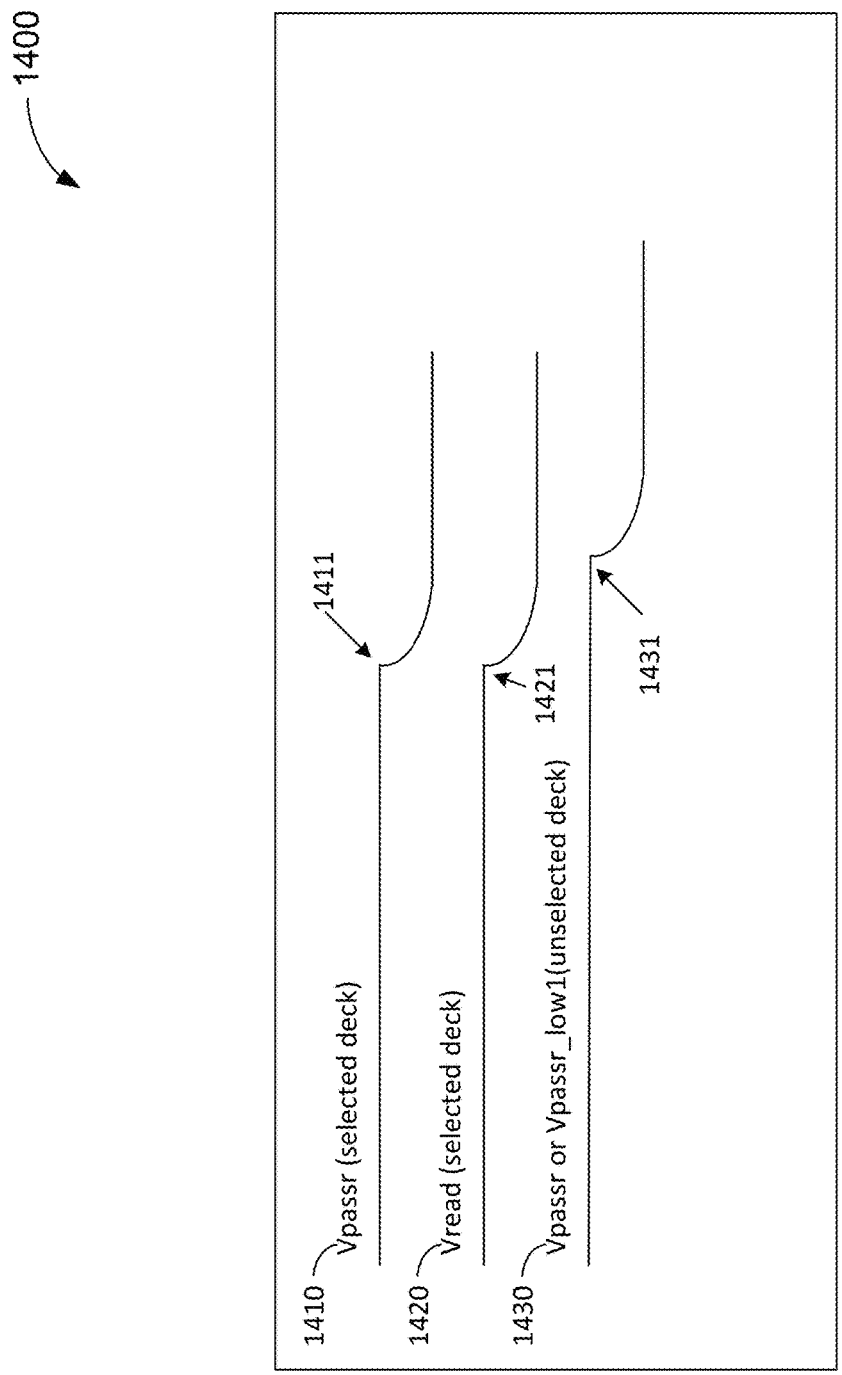
FIG. 14 illustrates WLs in unselected decks lowered after WLs in a selected deck following a program verify operation, in accordance with various embodiments.

FIG. 14 illustrates how voltage biases for program verify WLs in unselected decks may be lowered following those of the WLs in the selected deck, after a deck program verify operation in accordance with various embodiments. In voltage plots 1400 of FIG. 14 Vread represents the WL voltages on the WL being verified and Vpassr represents the WL voltages on all the other WLs. Thus, with reference to FIG. 14, Vpassr 1410 of a selected deck, and Vread 1420 of a selected deck, may each be lowered after a program verify operation as shown at voltage drop off points 1411 and 1421, respectively. In embodiments, following the drop in these voltages of the selected deck, then and only then may Vpassr 1430 be lowered for an unselected deck, as shown at voltage drop off point 1431. It is further here noted that if the unselected deck does not have Vpassr, because it is not programmed, so it has Vpassr_low1, as shown in FIG. 9 at 921, Vpassr_low1 would have the same timing as line 1430 in FIG. 14.

Figure 15:
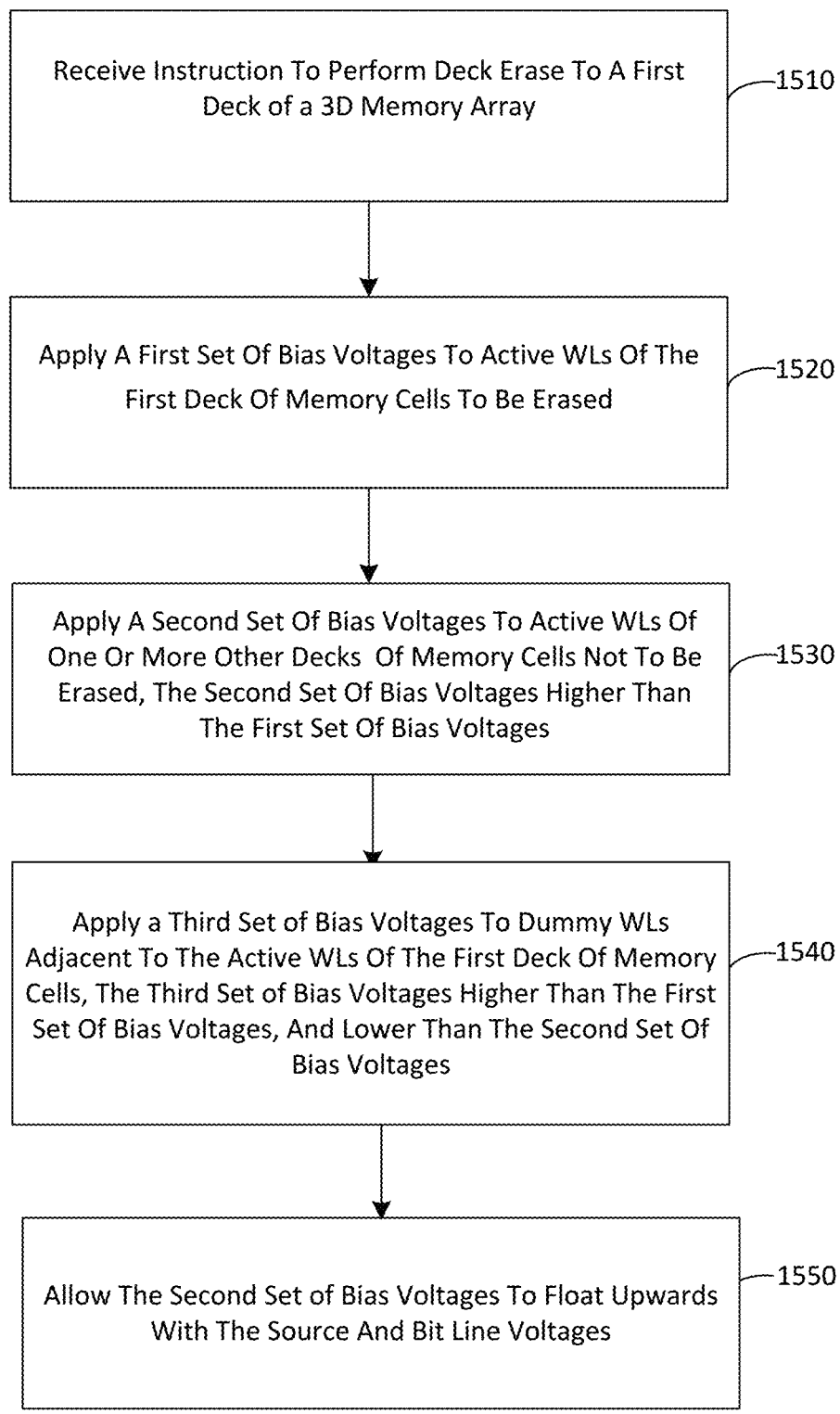
FIG. 15 illustrates an overview of the operational flow of a process for performing a deck erase operation, in accordance with various embodiments.

FIG. 15 illustrates an overview of the operational flow of a process for performing a deck erase operation for a memory array, such as is illustrated in FIGS. 4, 11 and 11A, in accordance with various embodiments. With reference thereto, process 1500 may be performed by a system or apparatus according to various embodiments. In embodiments, process 1500 may be performed by a controller for a memory array, which may, for example, include control circuitry. Process 1500 may include blocks 1510 through 1550. In alternate embodiments, process 1500 may have more or fewer operations, and some of the operations may be performed in a different order.

Process 1500 may begin at block 1510, where an example system or apparatus may receive an instruction to perform a deck erase operation to a first deck of a memory array. In embodiments, the memory array may be similar to memory array 300 of FIG. 3, or, for example, memory array 1000 of FIG. 10. From block 1510, process 1500 may proceed to block 1520, where a first set of bias voltages may be applied to active WLs of the first deck of memory cells to be erased. From block 1520, process 1500 may proceed to block 1530, where a second set of bias voltages may be applied to active WLs of one or more other decks of memory cells of the memory array that are not to be erased, the second set of bias voltages being higher than the first set of bias voltages.

From block 1530, process 1500 may optionally proceed to block 1540, where a third set of bias voltages may be applied, to dummy WLs of the memory array that are adjacent to the active WLs of the first deck of memory cells. In embodiments, the third set of bias voltages may be higher than the first set of bias voltages, as applied in block 1520, but lower than the second set of bias voltages applied in block 1530. From block 1540, process 1500 may proceed to block 1550, where the second set of bias voltages may be allowed to float upwards with the source and bit line voltages. Process 1500 may then terminate.

Figure 16:
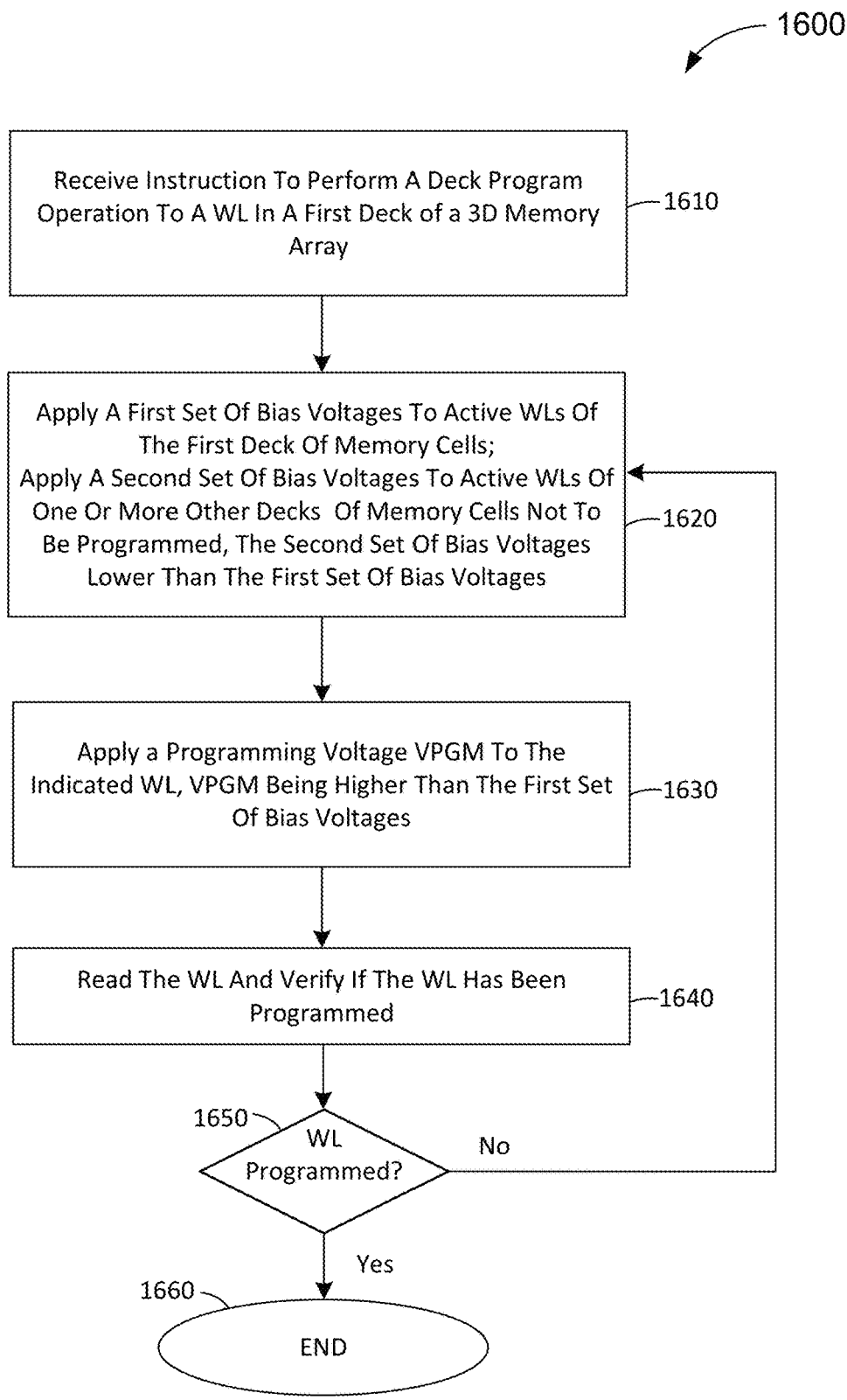
FIG. 16 illustrates an overview of the operational flow of a process for performing a deck program operation, in accordance with various embodiments.

FIG. 16 illustrates an overview of the operational flow of a process for performing a deck program operation to a WL in a selected deck of a memory array, such as is illustrated in FIGS. 6, 13 and 13A, in accordance with various embodiments. With reference thereto, process 1600 may be performed by a system or apparatus according to various embodiments. In embodiments, process 1600 may be performed by a controller for a memory array, such as memory controller 1724 of FIG. 17, for example, which may, for example, include control circuitry, such as, for example, control logic 1728 of FIG. 17. Process 1600 may include blocks 1610 through 1660. In alternate embodiments, process 1600 may have more or fewer operations, and some of the operations may be performed in a different order.

Process 1600 may begin at block 1610, where an example system or apparatus may receive an instruction to perform a deck program operation to a specified WL in a first deck of a memory array. In embodiments, the memory array may be similar to memory array 300 of FIG. 3, or, for example, multi-deck memory array 1000 of FIG. 10. In embodiments, the memory array may include poly plugs between its various decks, or, for example, in other embodiments, it may not. From block 1610, process 1600 may proceed to block 1620, where a first set of bias voltages may be applied to active WLs of the first deck of memory cells to be programmed, and a second set of bias voltages may be applied to active WLs of one or more other decks of memory cells of the memory array that are not to be programmed, the second set of bias voltages being lower than the first set of bias voltages.

From block 1620, process 1600 may proceed to block 1630, where a single programming pulse VPGM may be applied to the WL indicated in the program instruction of block 1610 to be programmed, the voltage VPGM being higher than the first set of bias voltages. From block 1630, process 1600 may proceed to block 1640, where the indicated WL may be read, to verify whether the WL was programmed. From block 1640, process 1600 may proceed to query block 1650, where it may be determined, given the check at block 1640, if the WL was, in fact, programmed. If Yes at query block 1650, then the programming command is complete for that WL. However, if the result is No at query block 1650, then process 1600 may return to block 1620 to start the process again.

Returning again to query block 1650, if the result was Yes, and the programming command was thus completed for that WL, process 1600 may proceed to block 1660, where process 1600 may terminate. It is here noted that, as shown in FIG. 16, only one WL is programmed in response to each programming command. Once the next programming command is received, then the programming flow illustrated in FIG. 16 may begin again on the next WL in sequence.

Figure 17:
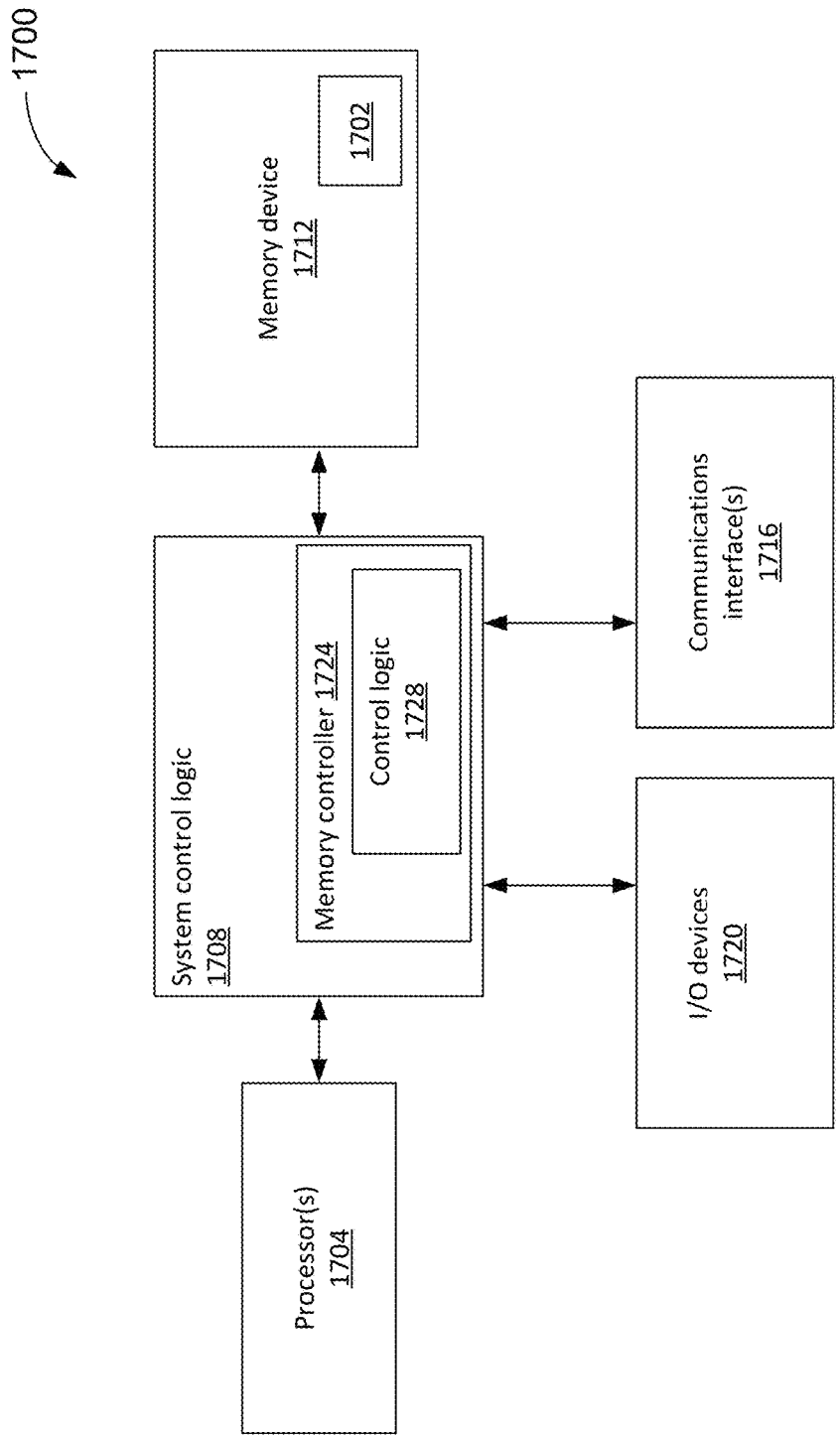
FIG. 17 schematically illustrates an example computing device that includes a memory device as described herein, in accordance with various embodiments.

FIG. 17 schematically illustrates an example computing device 1700 including a memory array having current leakage reduction techniques of the present disclosure, in accordance with some embodiments. In embodiments, the computing device 1700 may include system control logic 1708 coupled to one or more processor(s) 1704; a memory device 1712 having a memory array 1702; one or more communications interface(s) 1716; and input/output (I/O) devices 1720.

The memory device 1712 may be a non-volatile computer storage chip that may include the memory device 100, 200, 300, and/or 1000 with multiple memory decks per block of memory cells, as described herein. In addition to the memory array 1702, the memory device 1712 may include a package, having the memory device 100, 200, 300, and/or 1000 disposed therein, driver circuitry (e.g., drivers), input/output connections to electrically couple the memory device 1712 with other components of the computing device 1700, etc. The memory device 1712 may be configured to be removably or permanently coupled with the computing device 1700.

Communications interface(s) 1716 may provide an interface for computing device 1700 to communicate over one or more network(s) and/or with any other suitable device. Communications interface(s) 1716 may include any suitable hardware and/or firmware. Communications interface(s) 1716 for one embodiment may include, for example, a network adapter, a wireless network adapter, a telephone modem, and/or a wireless modem. For wireless communications, communications interface(s) 1716 for one embodiment may use one or more antennas to communicatively couple the computing device 1700 with a wireless network.

For one embodiment, at least one of the processor(s) 1704 may be packaged together with logic for one or more controller(s) of system control logic 1708. For one embodiment, at least one of the processor(s) 1704 may be packaged together with logic for one or more controllers of system control logic 1708 to form a System in Package (SiP). For one embodiment, at least one of the processor(s) 1704 may be integrated on the same die with logic for one or more controller(s) of system control logic 1708. For one embodiment, at least one of the processor(s) 1704 may be integrated on the same die with logic for one or more controller(s) of system control logic 1708 to form a System on Chip (SoC).

System control logic 1708 for one embodiment may include any suitable interface controllers to provide for any suitable interface to at least one of the processor(s) 1704 and/or to any suitable device or component in communication with system control logic 1708. The system control logic 1708 may move data into and/or out of the various components of the computing device 1700.

System control logic 1708 for one embodiment may include a memory controller 1724 to provide an interface to the memory device 1712 to control various memory access operations. Memory controller 1724 may include control logic 1728 that may be specifically configured to control access of the memory device 1712. Memory controller 1724 may be configured similarly to control circuit 116 of FIG. 1 to perform the erase, program, program and verify, and read operations described in the embodiments provided herein.

In various embodiments, the I/O devices 1720 may include user interfaces designed to enable user interaction with the computing device 1700, peripheral component interfaces designed to enable peripheral component interaction with the computing device 1700, and/or sensors designed to determine environmental conditions and/or location information related to the computing device 1700. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard.

In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 1716 to communicate with components of a positioning network, e.g., a global positioning system (GPS) satellite.

In various embodiments, the computing device 1700 may be a mobile computing device such as, but not limited to, a laptop computing device, a tablet computing device, a netbook, a smartphone, etc.; a desktop computing device; a workstation; a server; etc. The computing device 1700 may have more or fewer components, and/or different architectures. In further implementations, the computing device 1700 may be any other electronic device that processes data.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

Some non-limiting Examples of various embodiments are presented below.

EXAMPLES

Example 1 may include a controller for a NAND memory array, comprising: circuitry to provide bias voltages to the NAND memory array comprising two or more decks of memory cells; and an output interface coupled to the circuitry and wordlines (WLs) of the memory array, the circuitry, in a deck erase operation, to: apply a first set of bias voltages via the interface to active WLs of a first deck of memory cells to be erased; and apply a second set of bias voltages via the interface to active WLs of one or more other decks of memory cells not to be erased, wherein the first set of bias voltages is lower than the second set of bias voltages.

Example 2 may include the controller of example 1, and/or any other example herein, further comprising an input interface to the circuitry, to receive one or more instructions regarding a deck operation to perform on the memory array.

Example 3 may include the controller of example 2, and/or any other example herein, wherein the input interface is coupled to one or more processors, and is further to receive the one or more instructions from the one or more processors.

Example 4 may include the controller of any one of examples 1-3, and/or any other example herein, wherein the NAND memory array comprises at least three decks, and the circuitry is further to apply the first set of bias voltages via the output interface to active WLs of a third deck of the at least three decks of memory cells to be erased.

Example 5 may include the controller of example 4, and/or any other example herein, wherein to apply the second set of bias voltages to the active WLs includes to allow those WLs to float upwards to a source or bit line voltage of the NAND memory array.

Example 6 may include the controller of example 4, and/or any other example herein, wherein the circuitry is further to apply a third set of bias voltages, via the output interface, to edge dummy WLs of the first deck to form a graded transition region between the active WLs of the first deck and a select gate adjacent to the first deck.

Example 7 may include the controller of example 4, and/or any other example herein, wherein the first deck is adjacent to the second deck, and wherein the circuitry is further to apply a fourth set of bias voltages, via the output interface, to interface dummy WLs between the active WLs of the first deck and active WLs of the second deck, so as to form a graded transition region between the active WLs of the first deck and the active WLs of the second deck.

Example 8 may include the controller of example 4, and/or any other example herein, wherein the circuitry is further to apply the second set of bias voltages, via the output interface, to interface dummy WLs between any two decks of memory cells not to be erased.

Example 9 may include the controller of example 4, and/or any other example herein, wherein the circuitry is further, in a deck erase verify operation, to: apply a set of erase verify voltages, through the output interface, to a selected deck; and apply a high voltage bias to each WL of each unselected deck, where the high voltage bias is higher than the erase verify voltages.

Example 10 may include the controller of example 4, and/or any other example herein, wherein the first set of bias voltages is between 0V and 0.5V.

Example 11 may include the controller of example 5, and/or any other example herein, wherein the second set of bias voltages begins to float when it is greater than or equal to a voltage on a WL switch of the memory array.

Example 12 may include the controller of example 11, and/or any other example herein, wherein the first set of bias voltages is not allowed to float during the deck erase operation.

Example 13 may include a controller for a NAND memory array, comprising: circuitry to provide bias voltages to a NAND memory array comprising two or more decks of memory cells; and an output interface coupled to the circuitry and to wordlines (WLs) of the memory array, the circuitry to, in a deck program operation: apply a first set of bias voltages to active WLs of a first deck of memory cells including a WL to be programmed; and apply a second set of bias voltages to active WLs of one or more other decks of memory cells not to be programmed, wherein the first set of bias voltages is greater than the second set of bias voltages.

Example 14 may include the controller of example 13, and/or any other example herein, further comprising an input interface to the circuitry, coupled to one or more processors, to receive one or more instructions from the one or more processors, including a deck operation to perform on the memory array.

15. The controller of example 13, and/or any other example herein, wherein the NAND memory array comprises at least three decks, and the circuitry is further to apply the first set of bias voltages, via the output interface, to active WLs of a second deck of memory cells including a WL to be programmed.

Example 16 may include the controller of any one of examples 13-16, and/or any other example herein, wherein the first set of bias voltages comprises: a programming voltage Vpgm, applied to the WL of the first deck to be programmed; and another voltage, Vpass_sel, applied to active WLs of the first deck when they are not being programmed, where Vpgm>Vpass_sel.

Example 17 may include the controller of example 16, and/or any other example herein, wherein the memory array comprises only two decks, and the programming sequence for a deck begins at a center of the memory array and proceeds outwards to one of a source and drain of the memory array.

Example 18 may include a NAND memory array, comprising: a plurality of memory cells, respectively coupled to a plurality of wordlines (WLs); and a controller, comprising: circuitry to provide bias voltages to the memory cells; and an output interface coupled to the circuitry and to wordlines (WLs) of the memory array, the circuitry to, in a deck program verify operation: apply a first set of bias voltages to WLs of a first selected deck of memory cells; determine if one or more unselected decks of memory cells are programmed or erased; and in response to a determination that an unselected deck of memory cells is erased, apply a first voltage Vpassr_low1 to WLs of the unselected deck; or in response to a determination that an unselected deck of memory cells is programmed, apply a second voltage Vpassr to WLs of the unselected deck, wherein Vpassr_low1<Vpassr.

Example 19 may include the NAND memory array of example 18, and/or any other example herein, wherein Vpassr_low1 is 2-3 Volts lower than Vpassr.

Example 20 may include the NAND memory array of examples 18 or 19, and/or any other example herein, wherein the memory array comprises two or more decks, and the selected deck is one of a middle or internal deck, the output circuitry, following the program verify operation, further to, lower the WLs of the middle or internal deck, and hold the WLs of the non-selected decks high, to keep an electron discharge path open through a pillar of the memory array.

Example 21 may include the NAND memory array of example 20, and/or any other example herein, the output circuitry further to, first lower the WLs of the selected deck, and then lower the voltage of the WLs of the selected deck.

Example 22 may include the NAND memory array of example 18, and/or any other example herein, wherein the first set of bias voltages comprises: a voltage Vread applied to a selected WL to be read; a voltage Vpassr1 applied to WLs adjacent to the selected WL; and a voltage Vpassr applied to other programmed WLs of the selected deck.

Example 23 may include a method of providing bias voltages for a deck programming operation to a memory array that includes two or more decks of memory cells, comprising: applying a first set of bias voltages to active WLs of a first deck of memory cells including a first WL to be programmed; and applying a second set of bias voltages to active WLs of one or more other decks of memory cells not to be programmed, wherein the first set of bias voltages is greater than the second set of bias voltages.

Example 24 may include the method of example 23, and/or any other example herein, further comprising: applying the first set of bias voltages to active WLs of a second deck of memory cells including a second WL to be programmed.

Example 25 may include the method of either of examples 23-24, and/or any other example herein, wherein applying the first set of bias voltages includes: applying a programming voltage Vpgm to the first WL of the first deck to be programmed; and applying another voltage, Vpass_sel, to active WLs of the first deck other than the first WL, where Vpgm>Vpass_sel.

Example 26 may include the method of example 25, and/or any other example herein, wherein the memory array comprises only two decks, and further comprising beginning a programming sequence at a center of the first deck, and proceeding outwards to one of a source and drain of the memory array.

Example 27 may include a method of providing bias voltages for a deck erase operation to a memory array that includes two or more decks of memory cells, comprising: applying a first set of bias voltages to active WLs of at least a first deck of the two or more decks of memory cells to be erased; and applying a second set of bias voltages to active WLs of at least a second deck of the two or more decks of memory cells not to be erased, wherein the first set of bias voltages is lower than the second set of bias voltages.

Example 28 may include the method of example 27, and/or any other example herein, further comprising receiving one or more instructions regarding a deck erase operation to perform on the memory array.

Example 29 may include the method of either of examples 27 or 28, and/or any other example herein, wherein the memory array comprises at least three decks, further comprising applying the first set of bias voltages to active WLs of a third deck of the at least three decks of memory cells to be erased.

Example 30 may include the method of example 29, and/or any other example herein, wherein applying the second set of bias voltages to the active WLs includes allowing those WLs to float upwards to a source or bit line voltage of the memory array.

Example 31 may include the method of example 29, and/or any other example herein, further comprising applying a third set of bias voltages to edge dummy WLs of the first deck to form a graded transition region between the active WLs of the first deck and a select gate adjacent to the first deck.

Example 32 may include the method of example 29, and/or any other example herein, wherein the first deck is adjacent to the second deck, and further comprising applying a fourth set of bias voltages to interface dummy WLs between the active WLs of the first deck and active WLs of the second deck, so as to form a graded transition region between the active WLs of the first deck and the active WLs of the second deck.

Example 33 may include the method of example 29, and/or any other example herein, further comprising applying the second set of bias voltages to interface dummy WLs between any two decks of memory cells not to be erased.

Example 34 may include the method of example 29, and/or any other example herein, further comprising: applying a set of erase verify voltages to the selected deck; and applying a high voltage bias to each WL of each unselected deck, where the high voltage bias is higher than the erase verify voltages.

Example 35 may include the method of example 29, and/or any other example herein, wherein the first set of bias voltages is between 0V and 0.5V.

Example 36 may include the method of example 30, and/or any other example herein, wherein allowing the second set of bias voltages to float upwards includes first allowing the second set of bias voltages to float when they are greater than or equal to a voltage on a WL switch of the memory array.

Example 37 may include the method of example 30, and/or any other example herein, wherein the first set of bias voltages is not allowed to float during the deck erase operation.

Example 38 may include a method of providing bias voltages for a deck program verify operation to a NAND memory array that includes two or more decks of memory cells, comprising: applying a first set of bias voltages to WLs of a first selected deck of memory cells; determining if one or more unselected decks of memory cells are programmed or erased; and in response to a determination that an unselected deck of memory cells is erased, applying a first voltage Vpassr_low1 to WLs of the unselected deck; or in response to a determination that an unselected deck of memory cells is programmed, applying a second voltage Vpassr to WLs of the unselected deck, wherein Vpassr_low1<Vpassr.

Example 39 may include the method of example 38, and/or any other example herein, wherein Vpassr_low1 is 2-3 Volts lower than Vpassr.

Example 40 may include the method of either of examples 38 or 39, and/or any other example herein, wherein the memory array comprises two or more decks, and the selected deck is one of a middle or internal deck, further comprising:
lowering the voltages of WLs of the middle or internal deck, and holding the voltages of WLs of the unselected decks high, to keep an electron discharge path open through a pillar of the memory array.

Example 41 may include the method of example 40, and/or any other example herein, further comprising first lowering the WLs of the selected deck, and then lowering the voltage of the WLs of the unselected decks.

Example 42 may include the method of example 38, and/or any other example herein, wherein applying the first set of bias voltages comprises: applying a voltage Vread applied to a selected WL to be read; and applying a voltage Vpassr1 applied to WLs adjacent to the selected WL; and applying a voltage Vpassr applied to other programmed WLs of the selected deck.

Example 43 may include one or more non-transitory computer-readable storage media comprising a plurality of instructions that in response to being executed cause a computing device to perform the method of any of examples 23-42.

Example 44 may include the one or more non-transitory computer-readable storage media comprising a plurality of instructions that in response to being executed cause a computing device, in a deck programming operation of a memory array that includes two or more decks of memory cells, to: apply a first set of bias voltages to active WLs of a first deck of memory cells including a first WL to be programmed; and apply a second set of bias voltages to active WLs of one or more other decks of memory cells not to be programmed, wherein the first set of bias voltages is greater than the second set of bias voltages.

Example 45 may include the one or more non-transitory computer-readable storage media of example 44, and/or any other example herein, further comprising instructions that in response to being executed cause the computing device to: apply the first set of bias voltages to active WLs of a second deck of memory cells including a second WL to be programmed.

Example 46 may include the one or more non-transitory computer-readable storage media of either of examples 44 or 45, and/or any other example herein, wherein to apply the first set of bias voltages includes: apply a programming voltage Vpgm to the first WL of the first deck to be programmed; and apply another voltage, Vpass_sel, to active WLs of the first deck other than the first WL, where Vpgm>Vpass_sel.

Example 47 may include the one or more non-transitory computer-readable storage media of example 46, and/or any other example herein, wherein the memory array comprises only two decks, and further comprising instructions that in response to being executed cause the computing device to: begin a programming sequence at a center of the first deck, and proceed outwards to one of a source and drain of the memory array.

Example 48 may include the one or more non-transitory computer-readable storage media comprising a plurality of instructions that in response to being executed cause a computing device, in a deck erase operation of a memory array that includes two or more decks of memory cells, to: apply a first set of bias voltages to active WLs of at least a first deck of the two or more decks of memory cells to be erased; and apply a second set of bias voltages to active WLs of at least a second deck of the two or more decks of memory cells not to be erased, wherein the first set of bias voltages is lower than the second set of bias voltages.

Example 49 may include the one or more non-transitory computer-readable storage media of example 48, and/or any other example herein, further comprising instructions that in response to being executed cause the computing device to receive one or more instructions regarding a deck erase operation to perform on the memory array.

Example 50 may include the one or more non-transitory computer-readable storage media of either of examples 48 or 49, and/or any other example herein, wherein the memory array comprises at least three decks, further comprising instructions that in response to being executed cause the computing device to: apply the first set of bias voltages to active WLs of a third deck of the at least three decks of memory cells to be erased.

Example 51 may include the one or more non-transitory computer-readable storage media of example 50, and/or any other example herein, wherein to apply the second set of bias voltages to the active WLs includes allow those WLs to float upwards to a source or bit line voltage of the memory array.

Example 52 may include the one or more non-transitory computer-readable storage media of example 50, and/or any other example herein, further comprising instructions that in response to being executed cause the computing device to apply a third set of bias voltages to edge dummy WLs of the first deck to form a graded transition region between the active WLs of the first deck and a select gate adjacent to the first deck.

Example 53 may include the one or more non-transitory computer-readable storage media of example 50, and/or any other example herein, wherein the first deck is adjacent to the second deck, and further comprising instructions that in response to being executed cause the computing device to: apply a fourth set of bias voltages to interface dummy WLs between the active WLs of the first deck and active WLs of the second deck, so as to form a graded transition region between the active WLs of the first deck and the active WLs of the second deck.

Example 54 may include the one or more non-transitory computer-readable storage media of example 50, and/or any other example herein, further comprising instructions that in response to being executed cause the computing device to apply the second set of bias voltages to interface dummy WLs between any two decks of memory cells not to be erased.

Example 55 may include the one or more non-transitory computer-readable storage media of example 50, and/or any other example herein, further comprising instructions that in response to being executed cause the computing device to: apply a set of erase verify voltages to the selected deck; and apply a high voltage bias to each WL of each unselected deck, where the high voltage bias is higher than the erase verify voltages.

Example 56 may include the one or more non-transitory computer-readable storage media of example 50, and/or any other example herein, wherein the first set of bias voltages is between 0V and 0.5V.

Example 57 may include the one or more non-transitory computer-readable storage media of example 50, wherein to allow the second set of bias voltages to float upwards includes to first allow the second set of bias voltages to float when they are greater than or equal to a voltage on a WL switch of the memory array.

Example 58 may include the one or more non-transitory computer-readable storage media of example 51, and/or any other example herein, wherein the first set of bias voltages is not allowed to float during the deck erase operation.

Example 59 may include the or more non-transitory computer-readable storage media comprising a plurality of instructions that in response to being executed cause a computing device, in a deck program verify operation to a NAND memory array that includes two or more decks of memory cells, to: apply a first set of bias voltages to WLs of a first selected deck of memory cells; determine if one or more unselected decks of memory cells are programmed or erased; and: in response to a determination that an unselected deck of memory cells is erased, apply a first voltage Vpassr_low1 to WLs of the unselected deck; or in response to a determination that an unselected deck of memory cells is programmed, apply a second voltage Vpassr to WLs of the unselected deck, wherein Vpassr_low1<Vpassr.

Example 60 may include the one or more non-transitory computer-readable storage media of example 59, and/or any other example herein, wherein Vpassr_low1 is 2-3 Volts lower than Vpassr.

Example 61 may include the one or more non-transitory computer-readable storage media of either of examples 59 or 60, and/or any other example herein, wherein the NAND memory array comprises two or more decks, and the selected deck is one of a middle or internal deck, further comprising instructions that in response to being executed cause the computing device to: lower the voltages of WLs of the middle or internal deck, and hold the voltages of WLs of the unselected decks high, to keep an electron discharge path open through a pillar of the memory array.

Example 62 may include the one or more non-transitory computer-readable storage media of example 61, and/or any other example herein, further comprising instructions that in response to being executed cause the computing device to first lower the WLs of the selected deck, and then lower the voltage of the WLs of the unselected decks.

Example 63 may include the one or more non-transitory computer-readable storage media of example 59, and/or any other example herein, wherein to apply the first set of bias voltages comprises: apply a voltage Vread applied to a selected WL to be read; apply a voltage Vpassr1 applied to WLs adjacent to the selected WL; and apply a voltage Vpassr applied to other programmed WLs of the selected deck.

What is claimed is:

1. A controller for a NAND memory array, comprising:
    circuitry to provide bias voltages to the NAND memory array to define three or more decks of memory cells; and
    an output interface coupled to the circuitry and to wordlines (WLs) of the memory array, the circuitry, in a deck erase operation, to:
        apply a first set of bias voltages via the output interface to active WLs of at least one selected deck of the three or more decks of memory cells, the selected deck to be erased; and
        apply a second set of bias voltages via the output interface to active WLs of at least one unselected deck of the three or more decks of memory cells, the at least one unselected deck not to be erased,
        wherein the first set of bias voltages is lower than the second set of bias voltages.

2. The controller of claim 1, further comprising an input interface to the circuitry, to receive one or more instructions regarding a deck operation to perform on the memory array.

3. The controller of claim 2, wherein the input interface is coupled to one or more processors, and is further to receive the one or more instructions from the one or more processors.

4. The controller of claim 1, wherein the circuitry is further to apply the first set of bias voltages via the output interface to active WLs of an additional selected deck of memory cells, the additional selected deck also to be erased.

5. The controller of claim 1, wherein to apply the second set of bias voltages to the active WLs includes to allow those WLs to float upwards to a source or bit line voltage of the NAND memory array.

6. The controller of claim 1, wherein to define the three or more decks of memory cells further includes to apply a third set of bias voltages, via the output interface, to edge dummy WLs of the selected deck to form a graded transition region between the active WLs of the selected deck and a select gate adjacent to the selected deck.

7. The controller of claim 1, wherein the selected deck is adjacent to one or more unselected decks, and wherein to define the three or more decks of memory cells further includes to apply a fourth set of bias voltages, via the output interface, to interface dummy WLs between the active WLs of the selected deck and active WLs of the unselected decks, so as to form a graded transition region between the active WLs of the selected deck and the active WLs of the unselected decks.

8. The controller of claim 1, wherein to define the three or more decks of memory cells further includes to apply the second set of bias voltages, via the output interface, to interface dummy WLs between any two unselected decks of memory cells.

9. The controller of claim 1, wherein the circuitry is further, in a deck erase verify operation, to:
    apply a set of erase verify voltages, through the output interface, to a selected deck; and
    apply a high voltage bias to each WL of each unselected deck, where the high voltage bias is higher than the erase verify voltages.

10. The controller of claim 1, wherein the first set of bias voltages is between 0V and 0.5V.

11. The controller of claim 5, wherein the second set of bias voltages begins to float when it is greater than or equal to the voltage on a WL switch of the memory array.

12. The controller of claim 10, wherein the first set of bias voltages is not allowed to float during the deck erase operation.

13. A controller for a NAND memory array, comprising:
    circuitry to provide bias voltages to a NAND memory array to define three or more decks of memory cells; and
    an output interface coupled to the circuitry and to wordlines (WLs) of the memory array, the circuitry to,
    in a deck program operation:
        apply a first set of bias voltages to active WLs of a selected deck of memory cells including a WL to be programmed; and
        apply a second set of bias voltages to active WLs of unselected decks of memory cells not to be programmed,
        wherein the first set of bias voltages is greater than the second set of bias voltages.

14. The controller of claim 13, further comprising an input interface to the circuitry, coupled to one or more processors, to receive one or more instructions from the one or more processors, including a deck operation to perform on the memory array.

15. The controller of claim 13, wherein the circuitry is further to apply the first set of bias voltages, via the output interface, to active WLs of an additional selected deck of memory cells including a WL to be programmed.

16. The controller of claim 13, wherein the first set of bias voltages comprises:
    a programming voltage Vpgm, applied to the WL of the selected deck to be programmed;
    and another voltage, Vpass_sel, applied to active WLs of the selected deck when they are not being programmed, where Vpgm>Vpass_sel.

17. The controller of claim 16, wherein the circuitry is further to first lower the bias voltages on the WLs of the selected deck, and afterwards lower the bias voltages on the unselected decks.

18. A NAND memory array, comprising:
    a plurality of memory cells, respectively coupled to a plurality of wordlines (WLs); and
    a controller, comprising:
        circuitry to provide bias voltages to the memory cells to define three or more decks of memory cells; and
        an output interface coupled to the circuitry and to wordlines (WLs) of the memory array, the circuitry to,
        in a deck program verify operation:
            apply a first set of bias voltages to WLs of a selected deck of memory cells;

determine if one or more unselected decks of memory cells are programmed or erased; and:
in response to a determination that an unselected deck of memory cells is erased, apply a first voltage Vpassr_low1 to WLs of the unselected deck;
or
in response to a determination that an unselected deck of memory cells is programmed, apply a second voltage Vpassr to WLs of the unselected deck,
wherein Vpassr_low1<Vpassr.

19. The NAND memory array of claim 18, wherein Vpassr_low1 is 2-3 Volts lower than Vpassr.

20. The NAND memory array of claim 18, wherein the selected deck is one of a middle or an internal deck, and an output circuitry, following the program verify operation, is further to lower the WLs of the middle or internal deck, and hold the WLs of the non-selected decks high, to keep an electron discharge path open through a pillar of the memory array.

21. The NAND memory array of claim 20, the output circuitry further to; first lower the WLs of the selected deck, and afterwards lower the voltage of the WLs of the unselected decks.

22. The NAND memory array of claim 18, wherein the first set of bias voltages comprises:
a voltage Vread applied to a selected WL to be read;
a voltage Vpassr1 applied to WLs adjacent to the selected WL; and
a voltage Vpassr applied to other programmed WLs of the selected deck.

23. A method of providing bias voltages for a deck programming operation to a NAND memory array that define three or more decks of memory cells in a deck program operation, comprising:
applying a first set of bias voltages to active WLs of a first deck of memory cells including a first WL to be programmed;
applying a second set of bias voltages to active WLs of one or more other decks of memory cells not to be programmed, wherein the first set of bias voltages is greater than the second set of bias voltages;
first lowering the bias voltages on the WLs of the first deck; and
afterwards lowering the bias voltages on the one or more other decks.

24. The method of claim 23, further comprising:
applying the first set of bias voltages to active WLs of a deck of memory cells including a second WL to be programmed.

25. The method of claim 23, wherein applying the first set of bias voltages includes:
applying a programming voltage Vpgm to the first WL of the first deck to be programmed; and
applying another voltage, Vpass_sel, to active WLs of the first deck other than the first WL, where Vpgm > Vpass_sel.

* * * * *